US012665317B2

(12) United States Patent (10) Patent No.: US 12,665,317 B2
Mizuno et al. (45) Date of Patent: Jun. 23, 2026

(54) ANTENNA AND CIRCUIT BOARD

(71) Applicant: YOKOWO CO., LTD., Tokyo (JP)

(72) Inventors: Hirotoshi Mizuno, Gunma (JP);
Kazuhiro Kowaita, Gunma (JP)

(73) Assignee: YOKOWO CO., LTD., Tokyo (JP)

( * ) Notice: Subject to any disclaimer, the term of this
patent is extended or adjusted under 35
U.S.C. 154(b) by 93 days.

(21) Appl. No.: 18/723,699

(22) PCT Filed: Dec. 20, 2022

(86) PCT No.: PCT/JP2022/046847
§ 371 (c)(1),
(2) Date: Jun. 24, 2024

(87) PCT Pub. No.: WO2023/127595
PCT Pub. Date: Jul. 6, 2023

(65) Prior Publication Data
US 2025/0070481 A1 Feb. 27, 2025

(30) Foreign Application Priority Data
Dec. 27, 2021 (JP) ................................. 2021-212021

(51) Int. Cl.
H03H 7/32 (2006.01)
H01P 5/08 (2006.01)
(Continued)

(52) U.S. Cl.
CPC ............. H01Q 21/065 (2013.01); H01P 5/08
(2013.01); H01P 5/16 (2013.01); H03H 7/32
(2013.01)

(58) Field of Classification Search
CPC .... H01P 5/08; H01P 5/16; H03H 7/18; H03H
7/42; H03H 7/30; H03H 7/32; H01Q
13/08; H01Q 21/24; H01Q 21/065
(Continued)

(56) References Cited

U.S. PATENT DOCUMENTS 5,343,173 A 8/1994 Balodis et al.
5,745,079 A 4/1998 Wang et al.
(Continued)

FOREIGN PATENT DOCUMENTS

CN 110994199 A 4/2020
JP H05-315834 A 11/1993
(Continued)

OTHER PUBLICATIONS

Oct. 25, 2022, Japanese Office Action issued for related JP Application No. 2021-212021.

*Primary Examiner* — Stephen E. Jones
(74) *Attorney, Agent, or Firm* — Paratus Law Group,
PLLC

(57) ABSTRACT

Provided is an antenna that suppresses increase in passing loss when phase-shifting signals input from an antenna element throughout a wide frequency band. The antenna includes a power feeding circuit 20 that converts four input signals input with phase differences different by 90 degrees from an antenna element so that the four input signals have a same phase and outputs them as one combined signal from an output terminal s31. The power feeding circuit 20 includes a first phase circuit portion 200A that phase-shifts the four input signals and combines them two by two to output two first combined signals, and a second phase circuit portion 200B that phase-shifts each of the two first combined signals by 90 degrees by reversing a shift direction to combine the two first combined signals. The second phase circuit portion 200B includes cascade-type phase shifters 241, 242 in which two 45 degrees phase-shifters or three 30 degrees phase shifters are connected in series.

10 Claims, 21 Drawing Sheets

(51) Int. Cl.
H01P 5/16 (2006.01)
H01Q 21/06 (2006.01)

(58) Field of Classification Search
USPC ........................................................ 333/138
See application file for complete search history.

(56) References Cited

U.S. PATENT DOCUMENTS 6,989,788 B2 * 1/2006 Marion ................ H01Q 3/2682
333/164
2014/0347143 A1 11/2014 Oppelt
2023/0044376 A1 2/2023 Imamura

FOREIGN PATENT DOCUMENTS

| | | | |
|---|---|---|---|
| JP | H10-150320 | A | 6/1998 |
| JP | 2002-033635 | A | 1/2002 |
| JP | 2010-021630 | A | 1/2010 |
| JP | 2010-021631 | A | 1/2010 |
| JP | 2021-111813 | A | 8/2021 |
| WO | WO 2021/140738 | A1 | 7/2021 |

* cited by examiner

[FIG. 1]
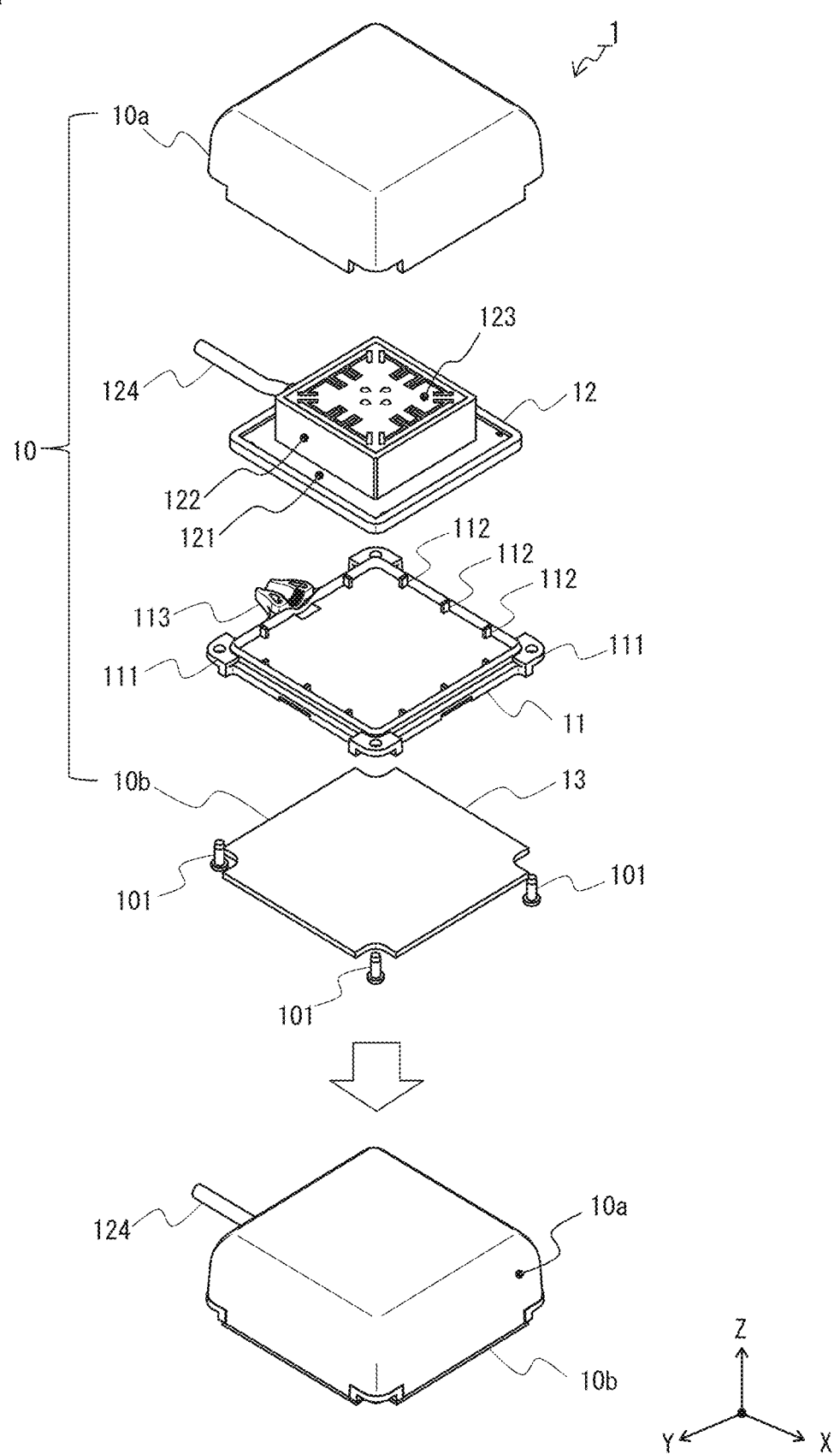

[FIG. 2]
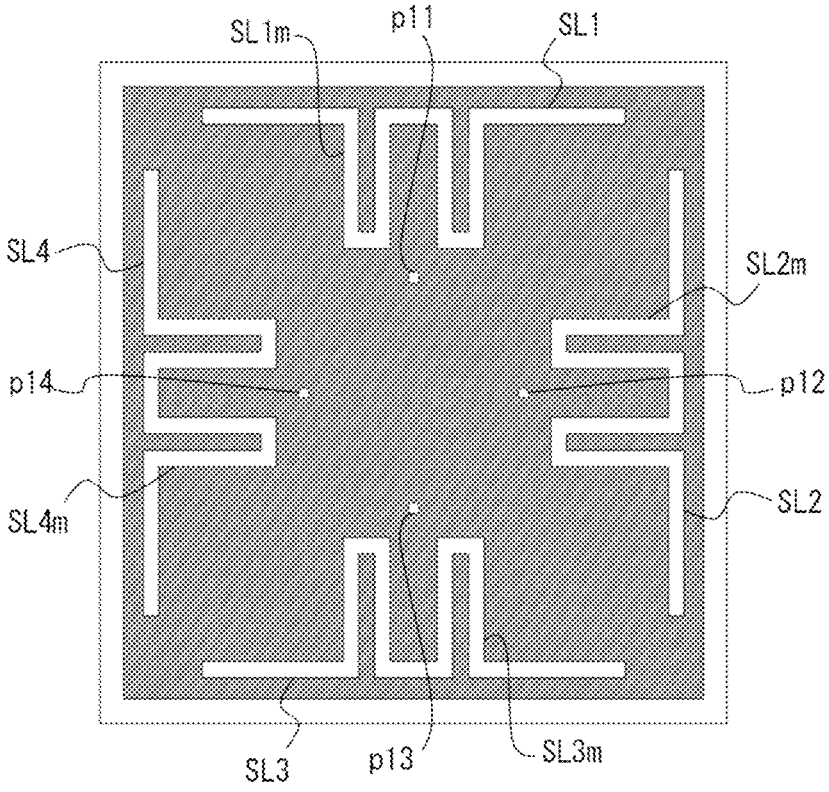
[FIG. 3]
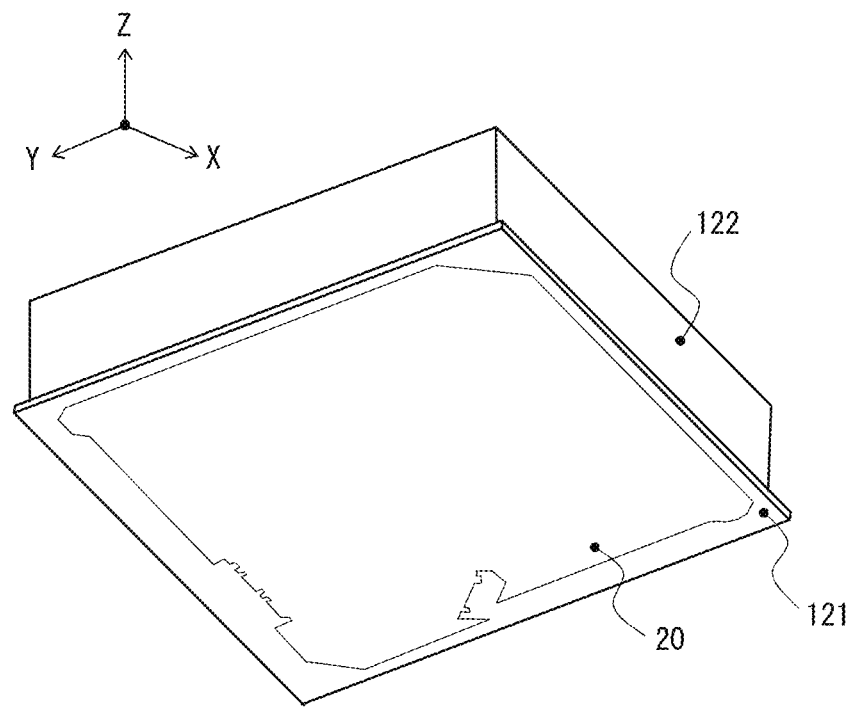

[FIG. 4]
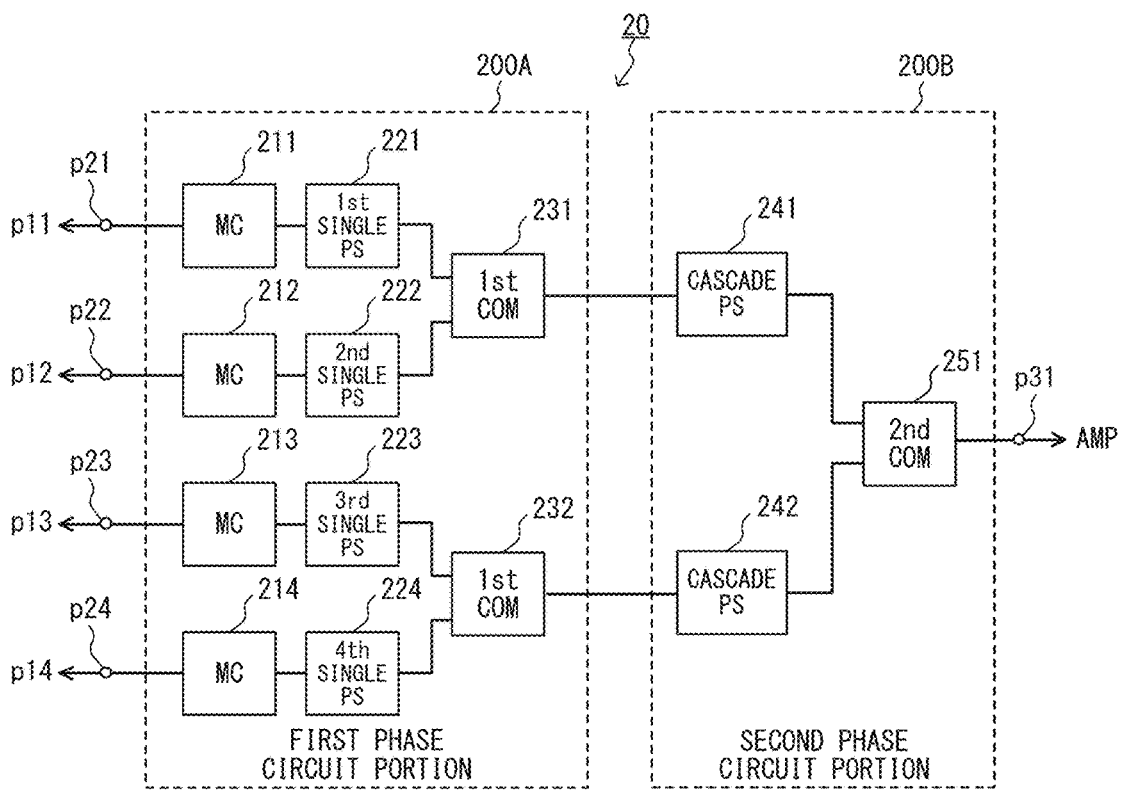
MC: MATCHING CIRCUIT,    PS: PHASE SHIFTER,
COM: COMBINER,    AMP: AMPLIFICATION CIRCUIT
[FIG. 5]
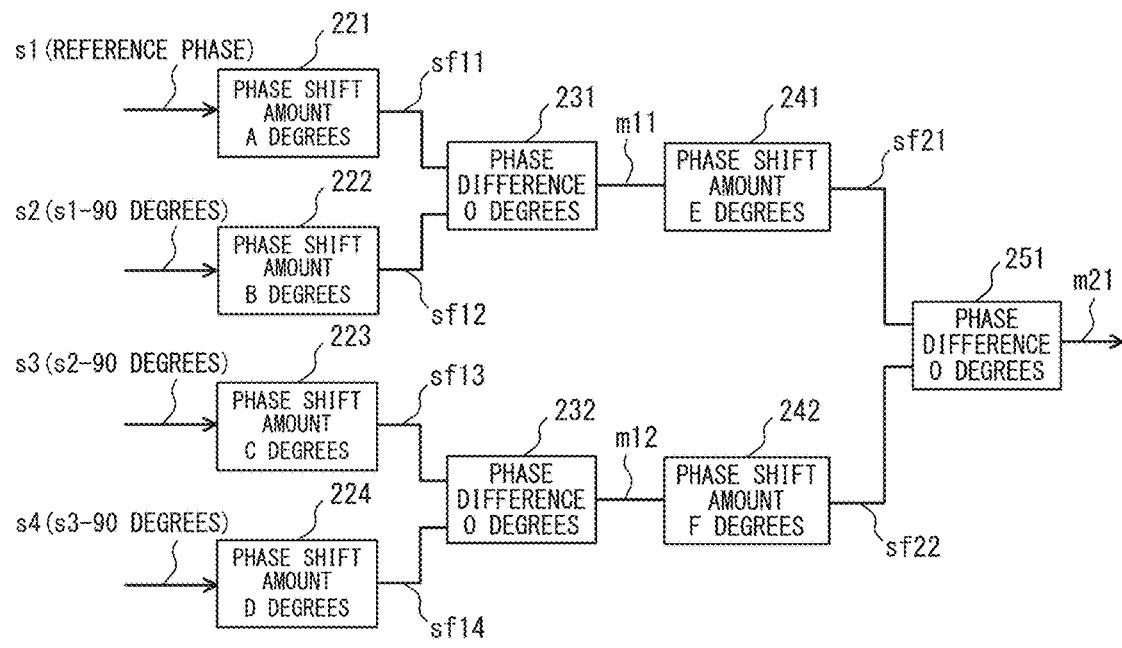

[FIG. 6]
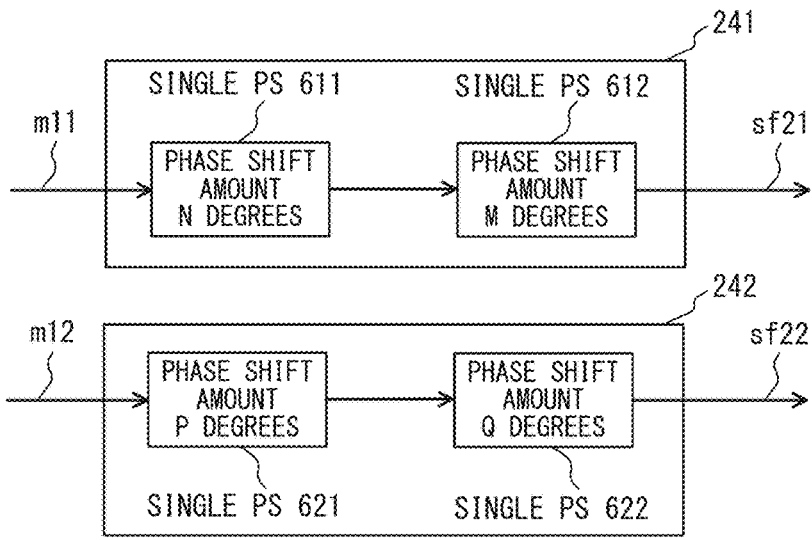
[FIG. 7]
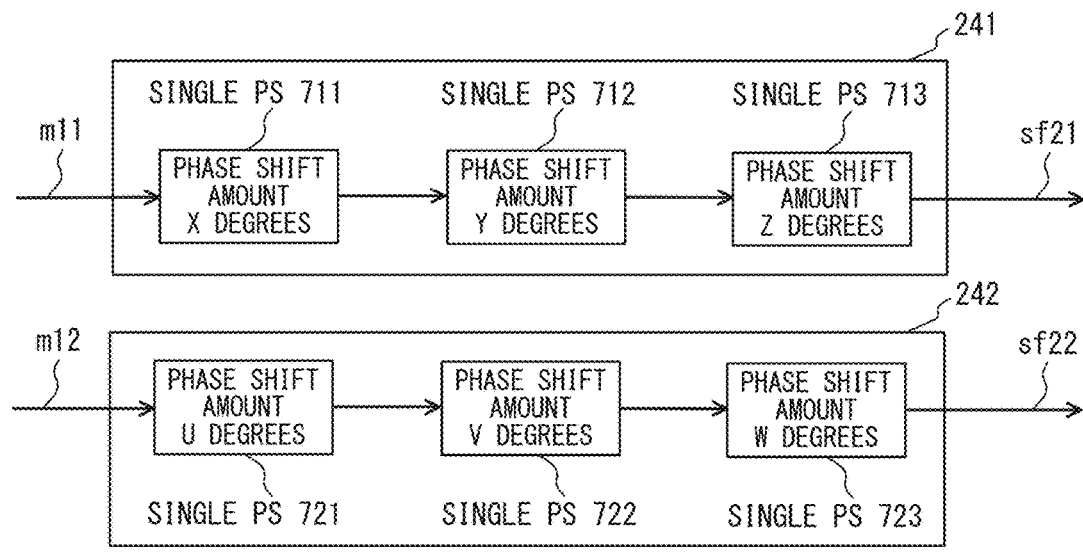

[FIG. 8]
<-90 DEGREES π-TYPE 1-STAGE PS>          <-90 DEGREES π-TYPE 2-STAGE PS>
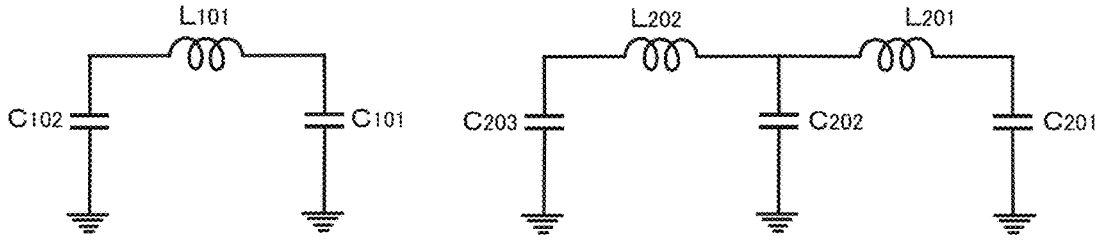
<-90 DEGREES π-TYPE 3-STAGE PS>
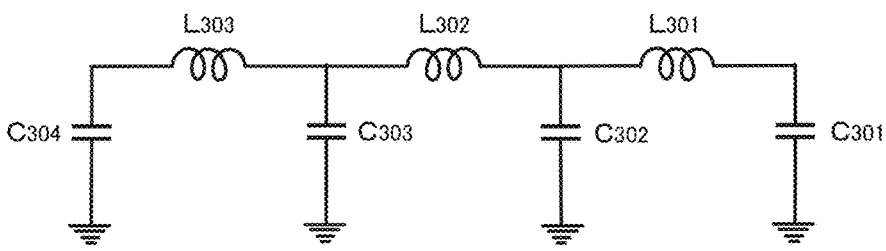
[FIG. 9]
<-90 DEGREES T-TYPE 1-STAGE PS>          <-90 DEGREES T-TYPE 2-STAGE PS>
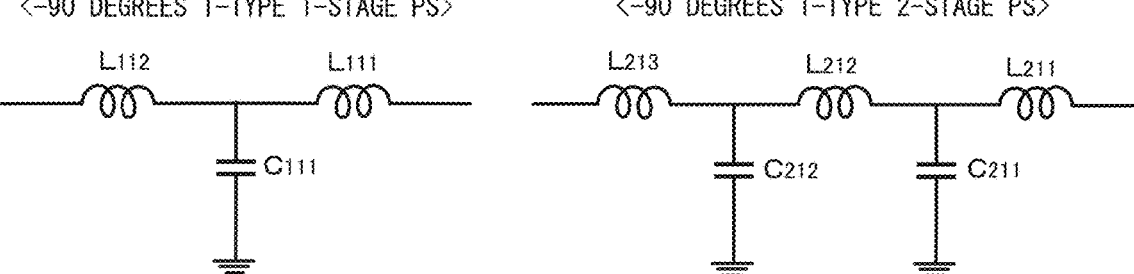
<-90 DEGREES T-TYPE 3-STAGE PS>
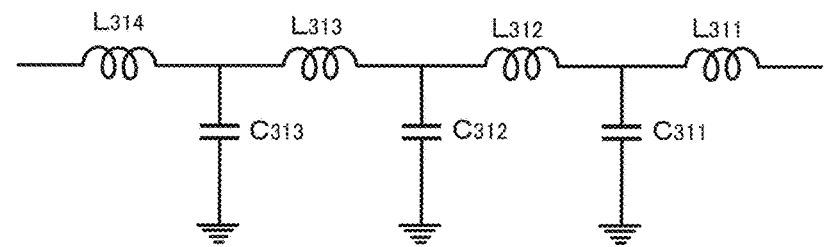

[FIG. 10]
<+90 DEGREES π-TYPE 1-STAGE PS>        <+90 DEGREES π-TYPE 2-STAGE PS>
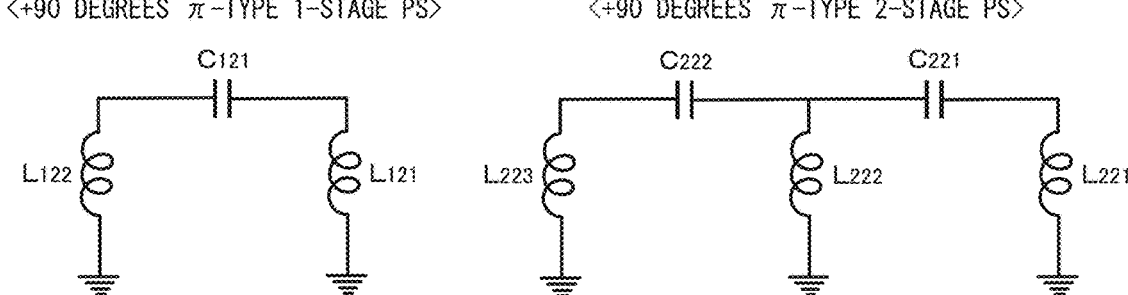
<+90 DEGREES π-TYPE 3-STAGE PS>
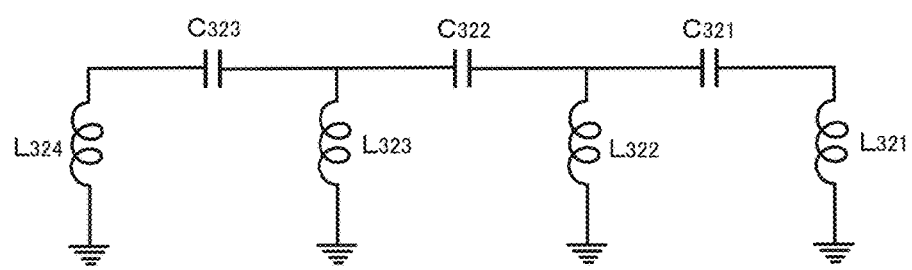
[FIG. 11]
<+90 DEGREES T-TYPE 1-STAGE PS>        <+90 DEGREES T-TYPE 2-STAGE PS>
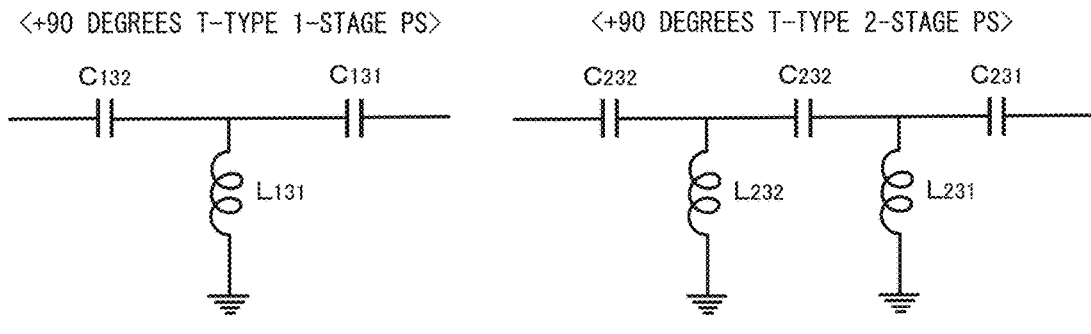
<+90 DEGREES T-TYPE 3-STAGE PS>
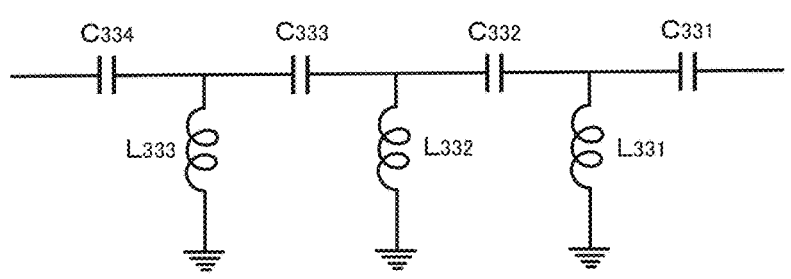

[FIG. 12]
<-90 DEGREES π-TYPE 2-STAGE PS>
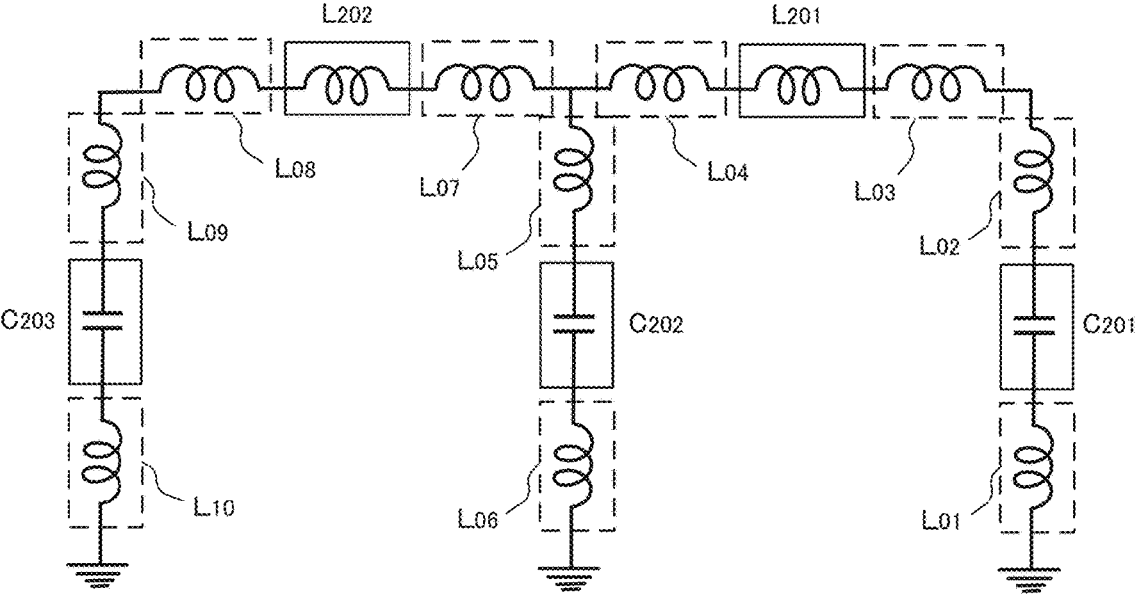
<+90 DEGREES π-TYPE 2-STAGE PS>
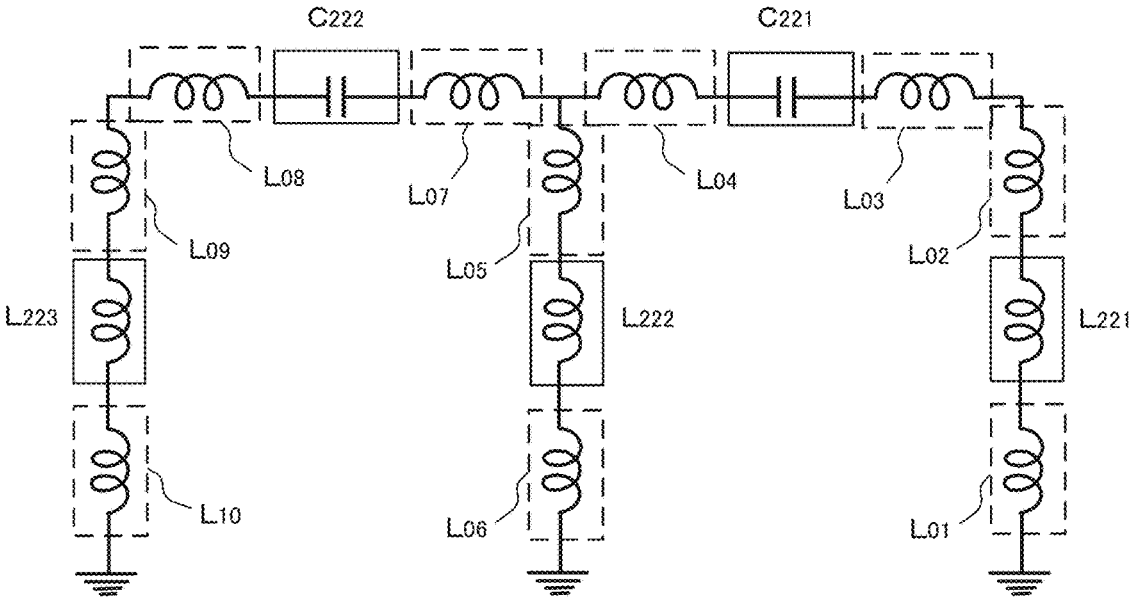

[FIG. 13]
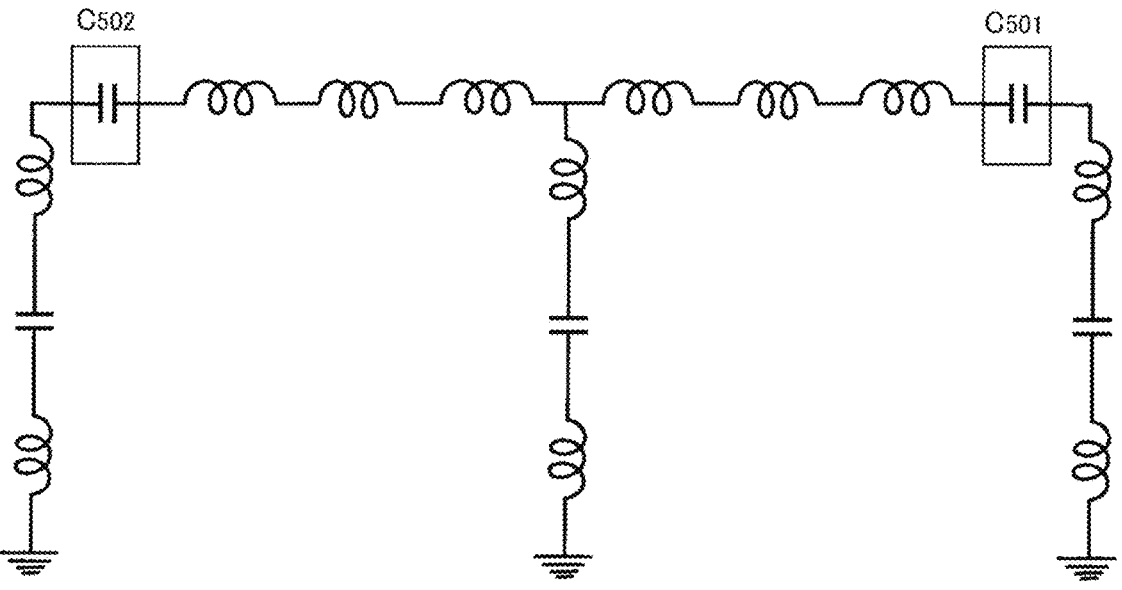
[FIG. 14]
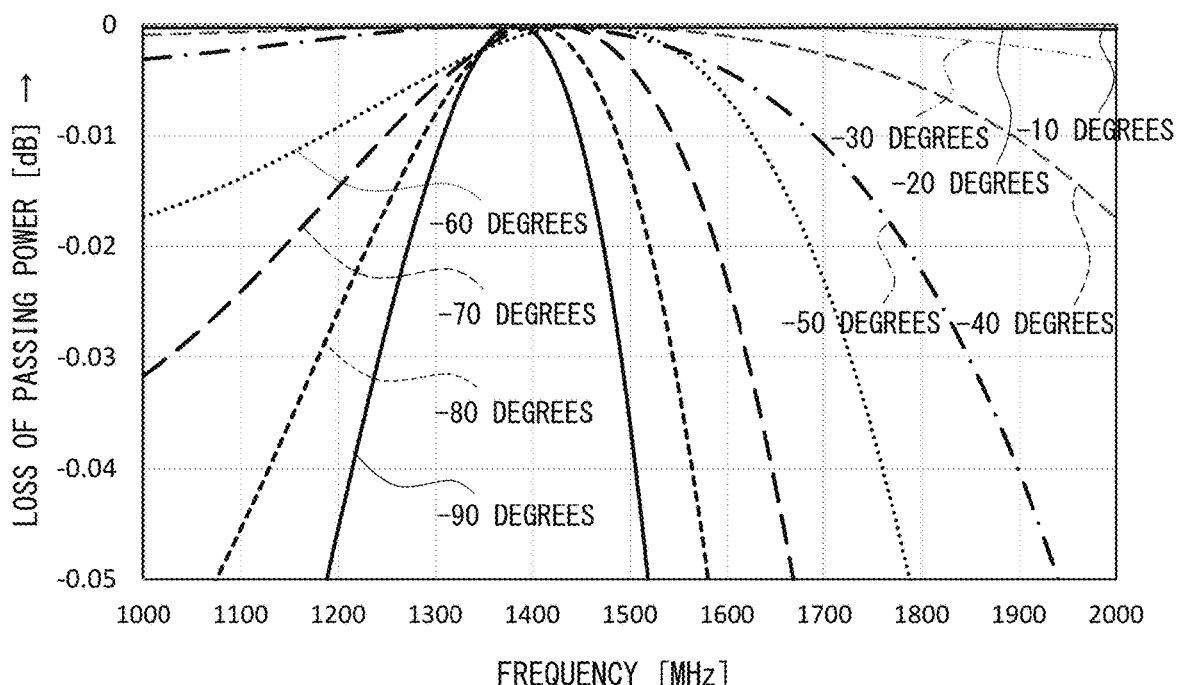

[FIG. 15]
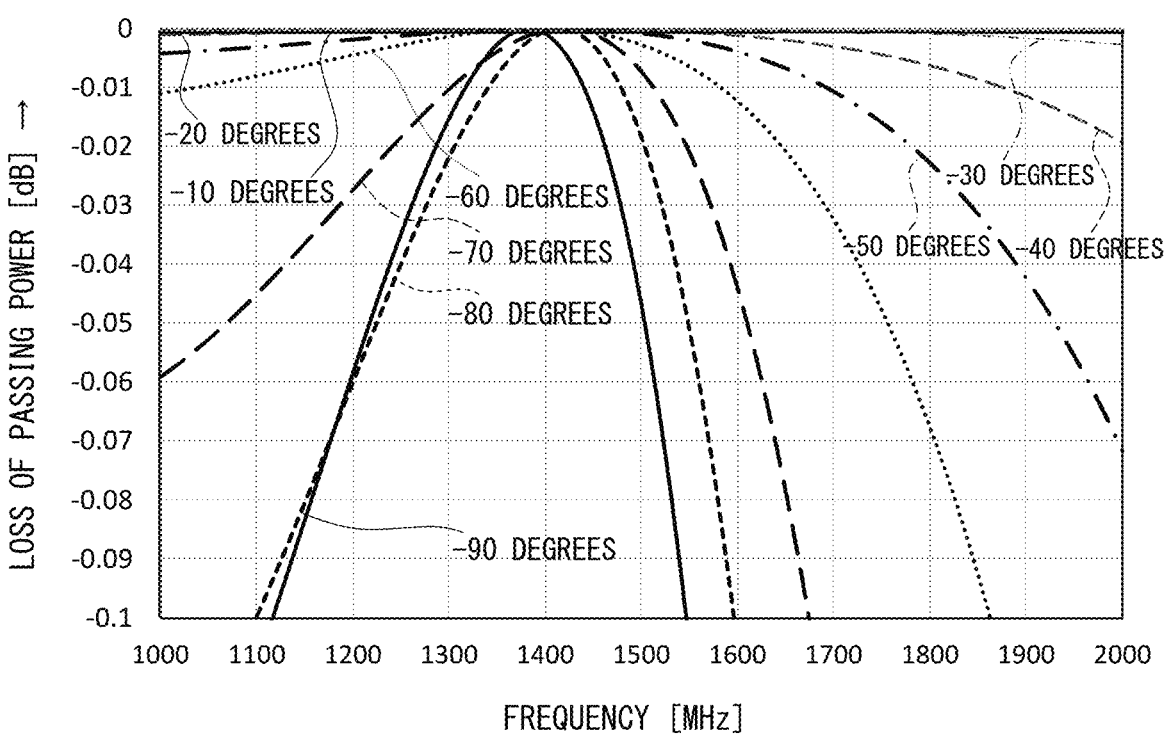
[FIG. 16]
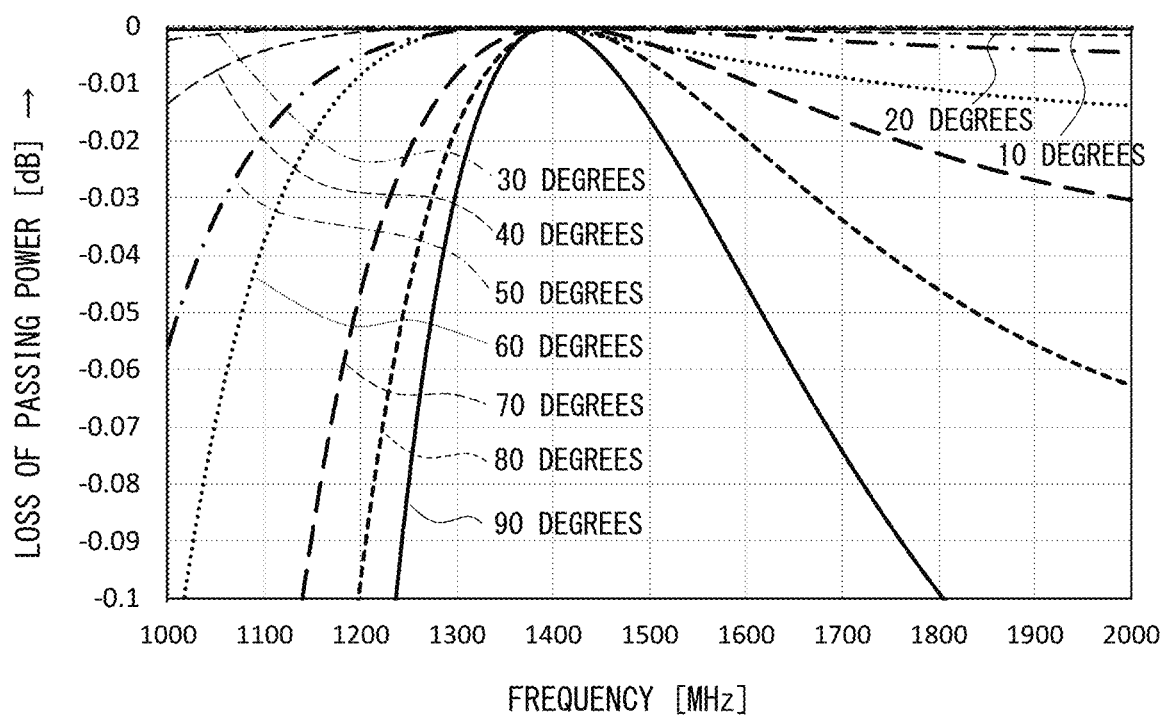

[FIG. 17]
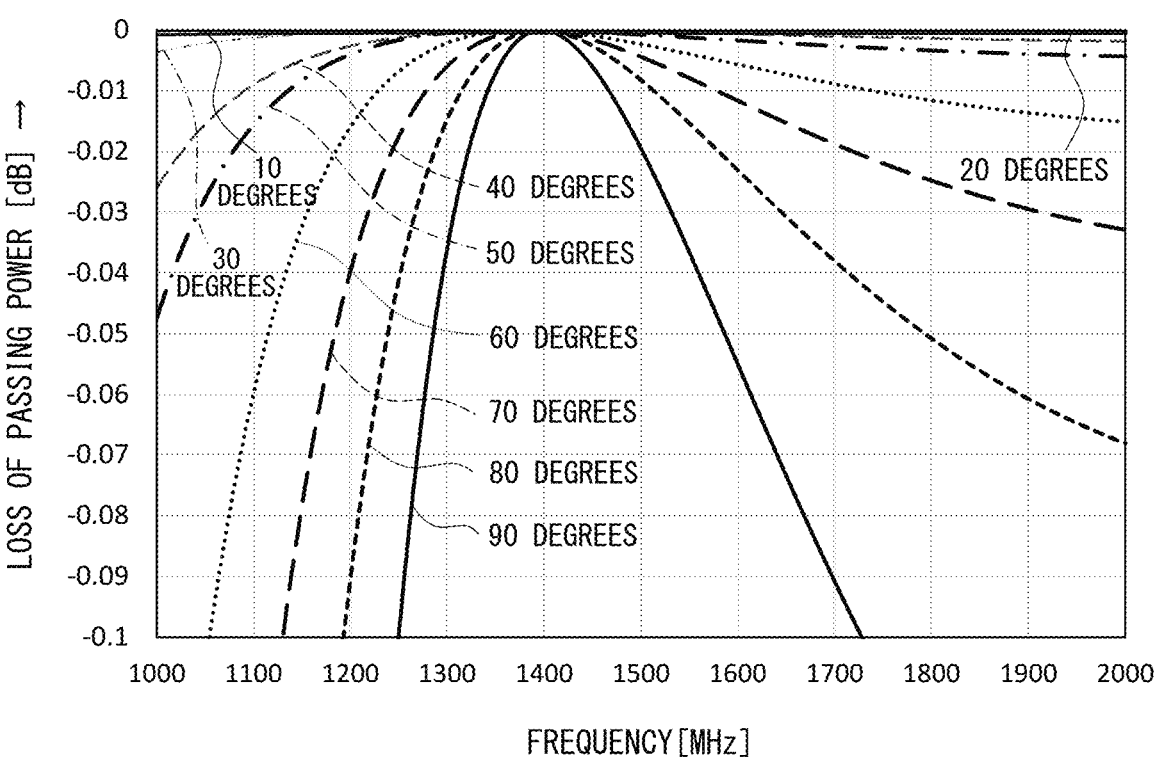
[FIG. 18]
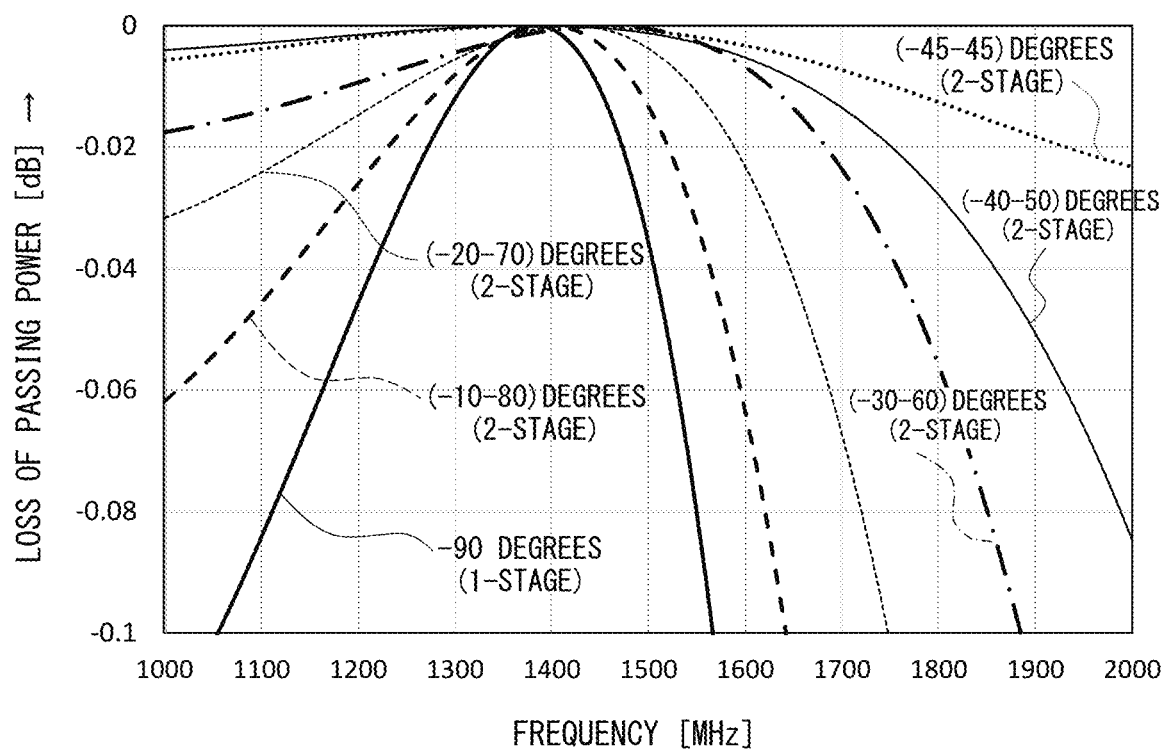

[FIG. 19]
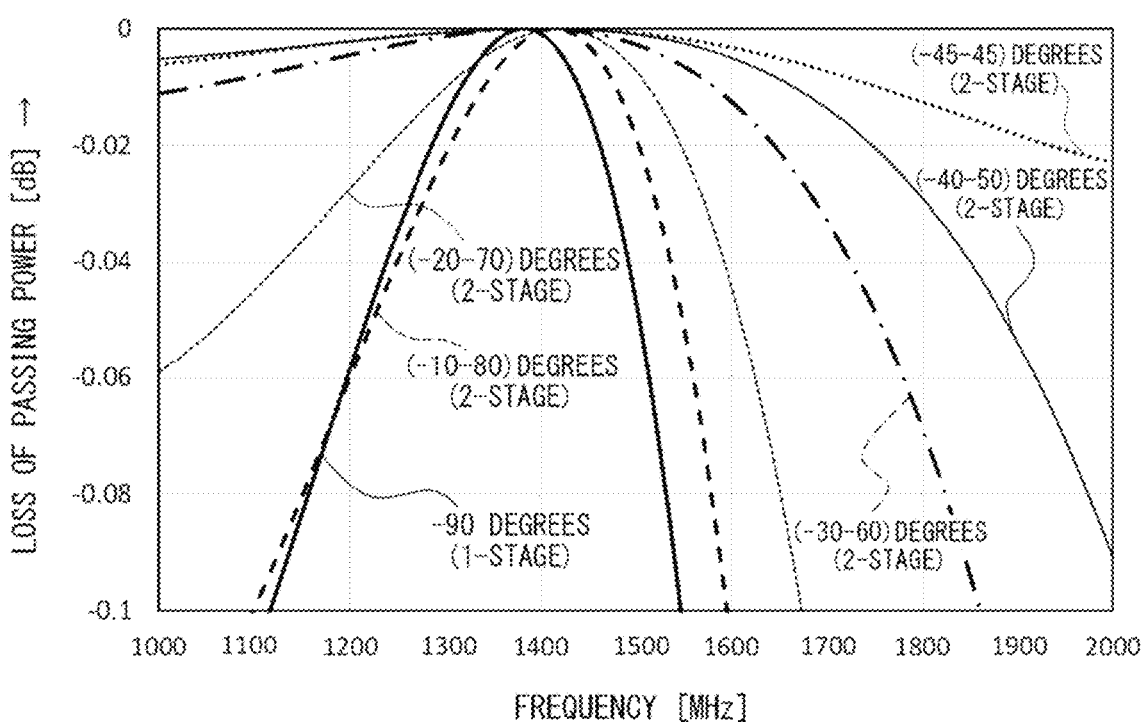
[FIG. 20]
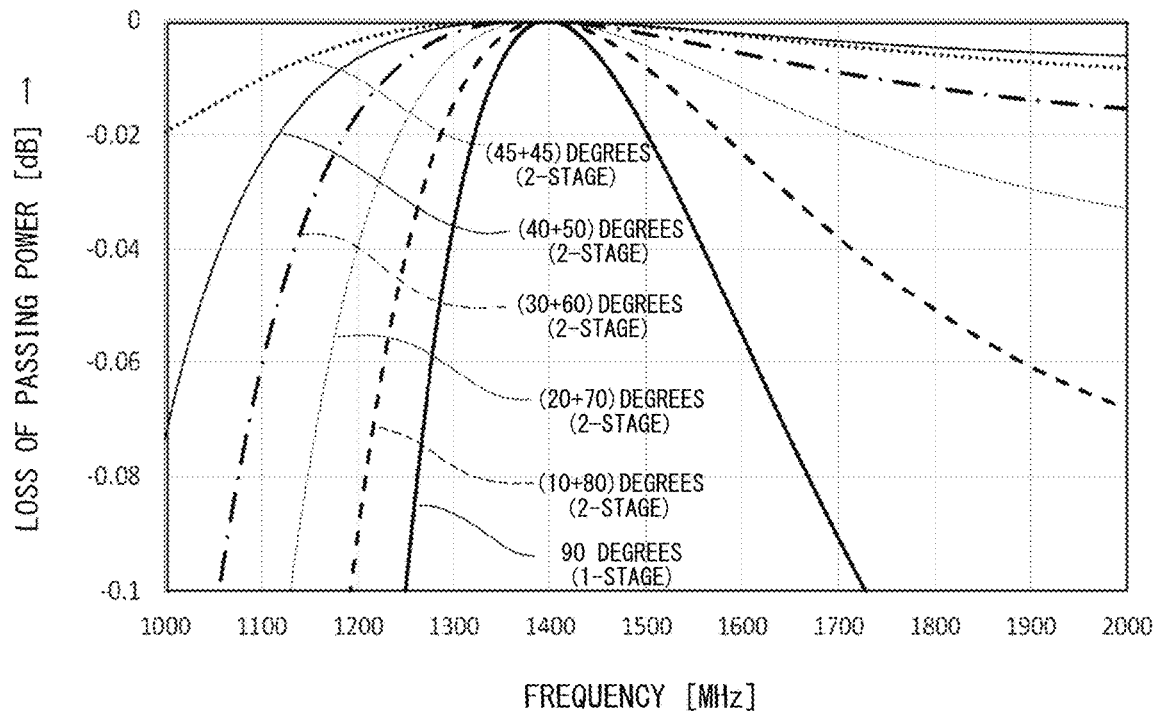

[FIG. 21]
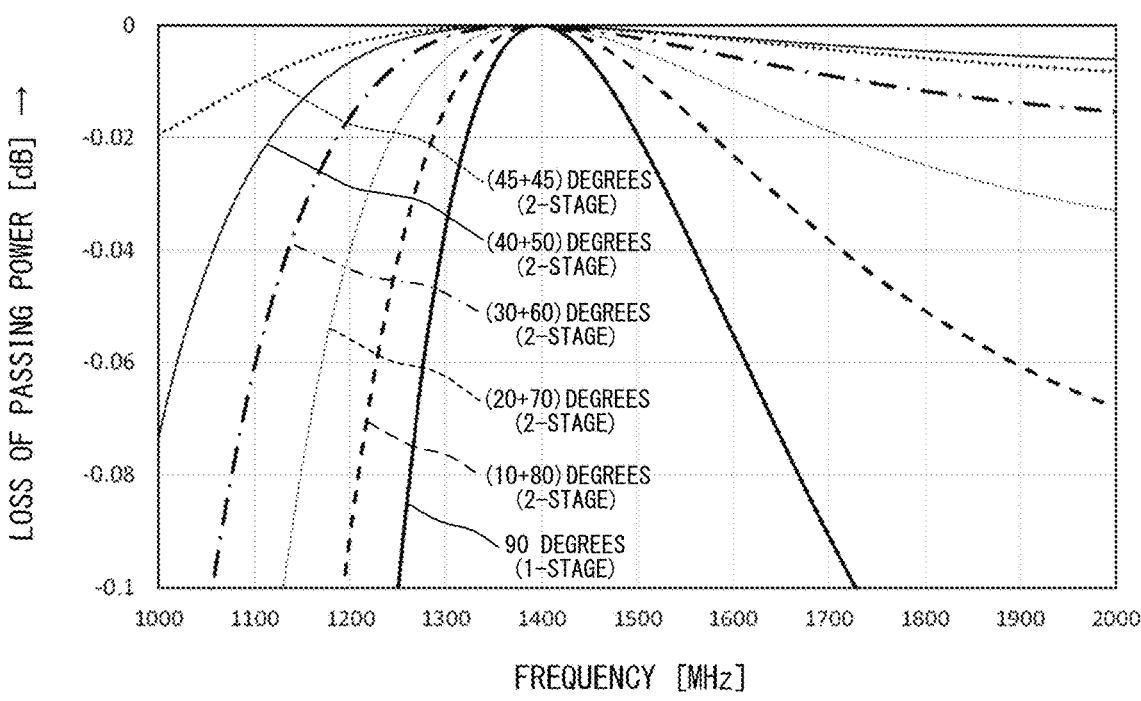
[FIG. 22]
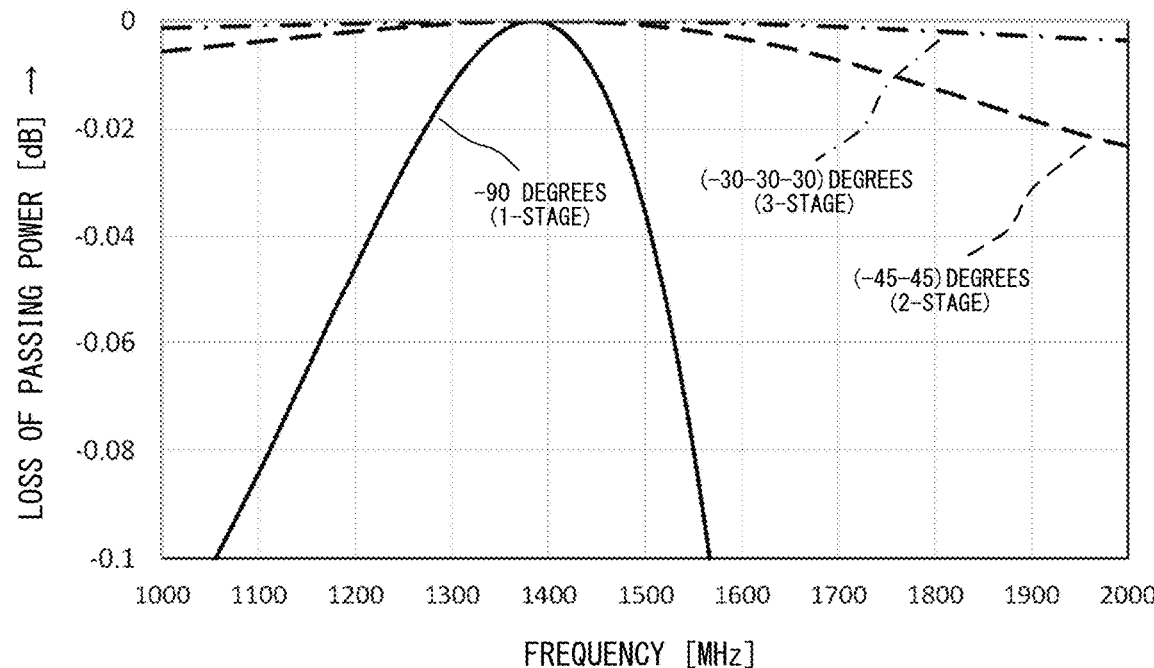

[FIG. 23]
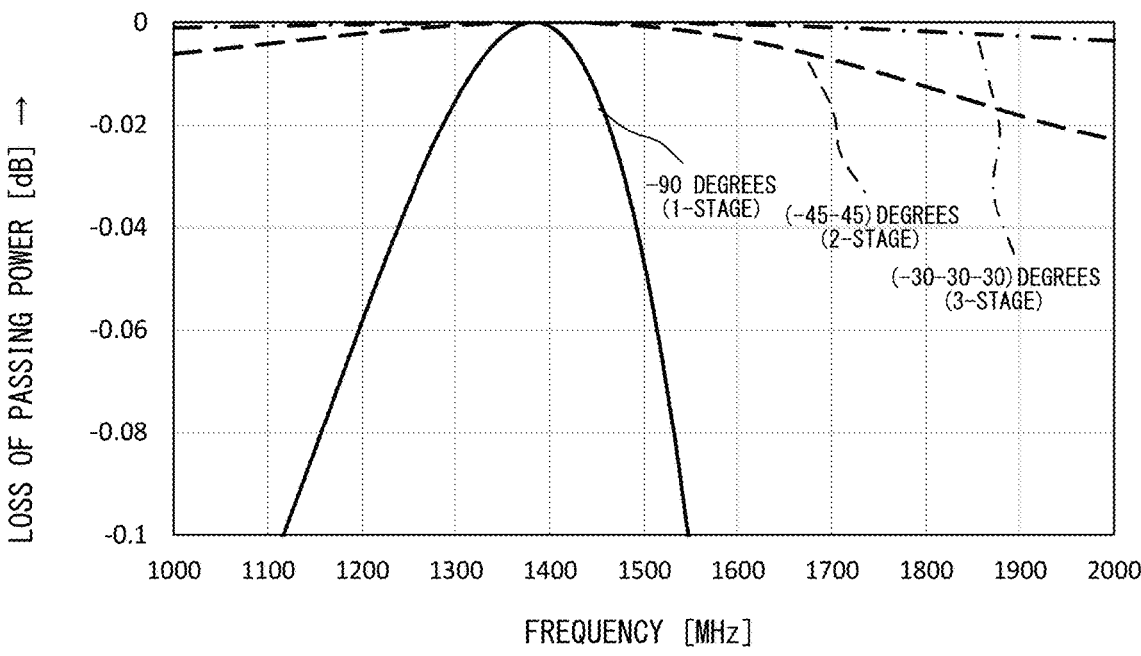
[FIG. 24]
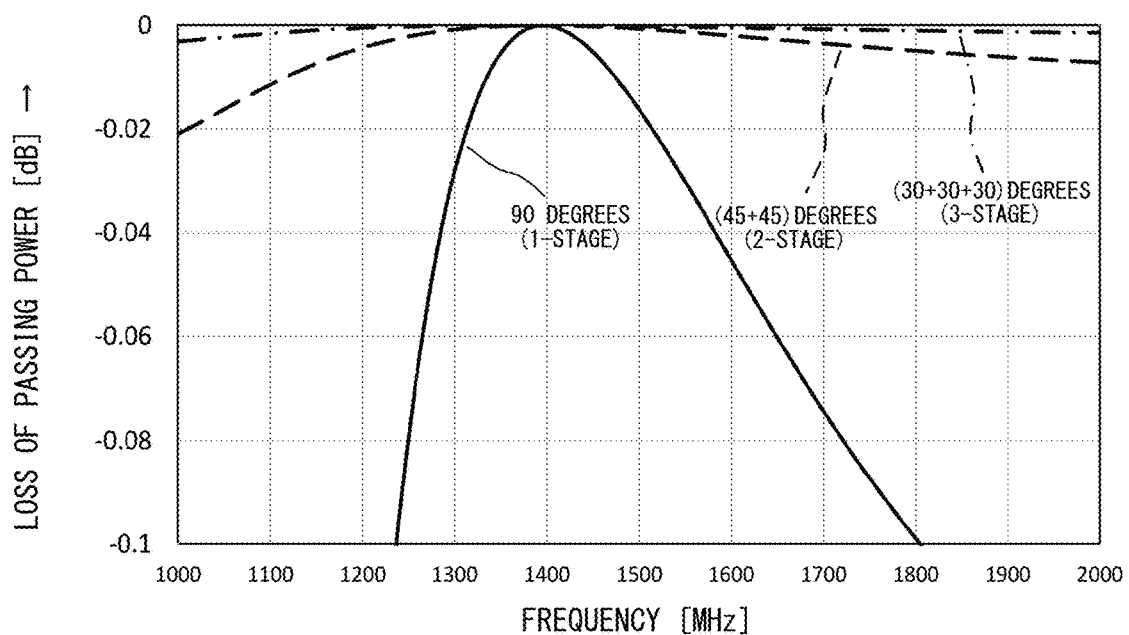

[FIG. 25]
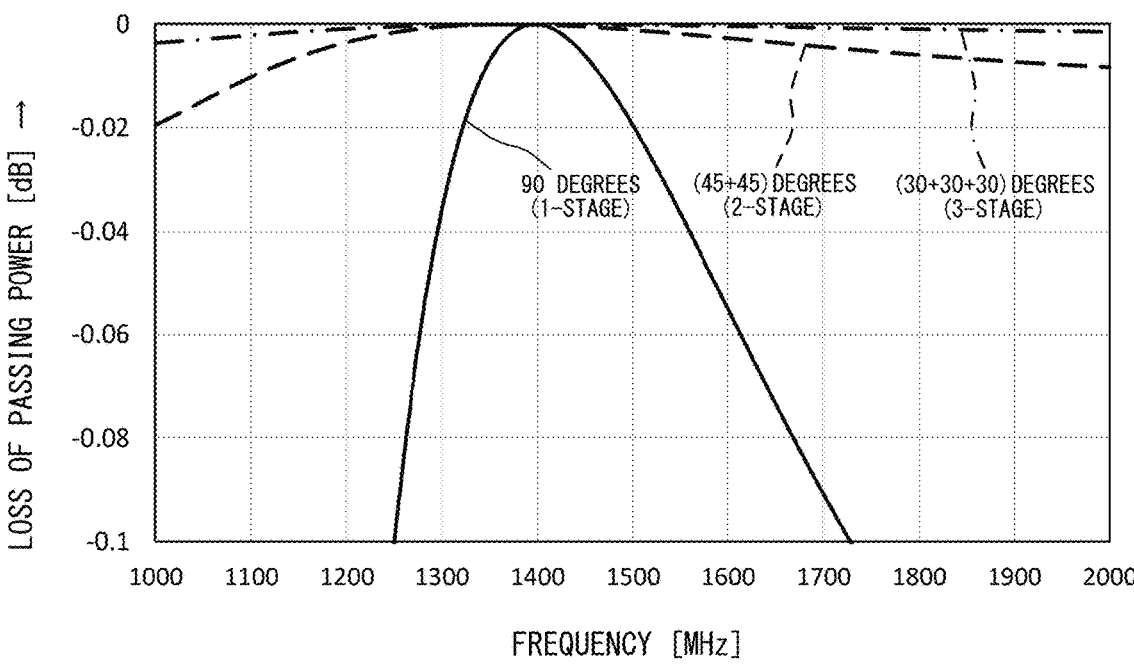
[FIG. 26]
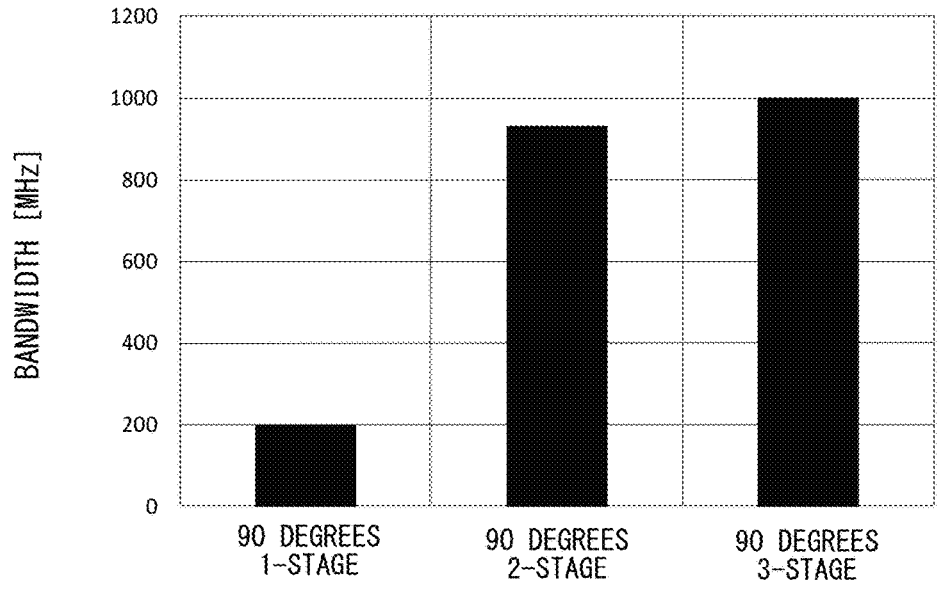

[FIG. 27]
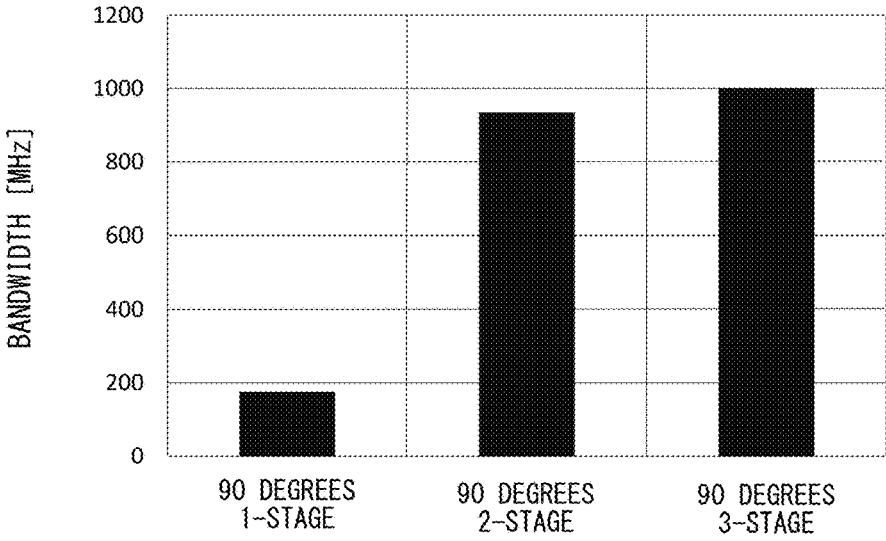
[FIG. 28]
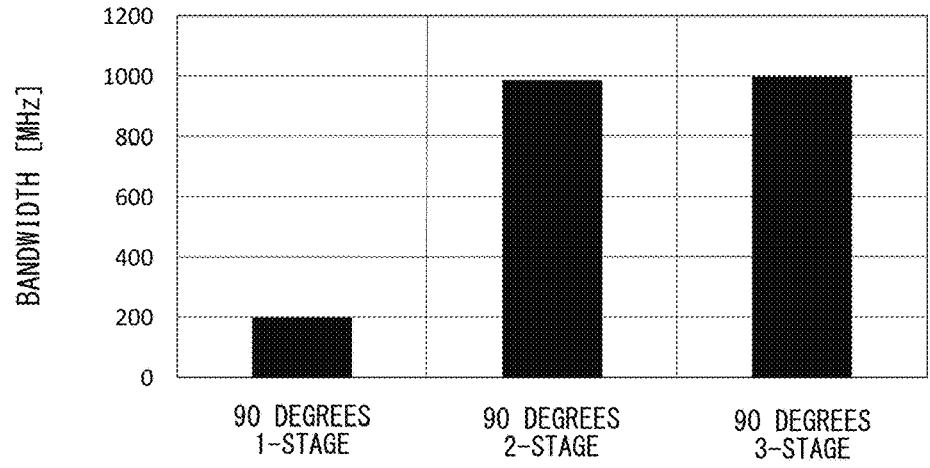
[FIG. 29]
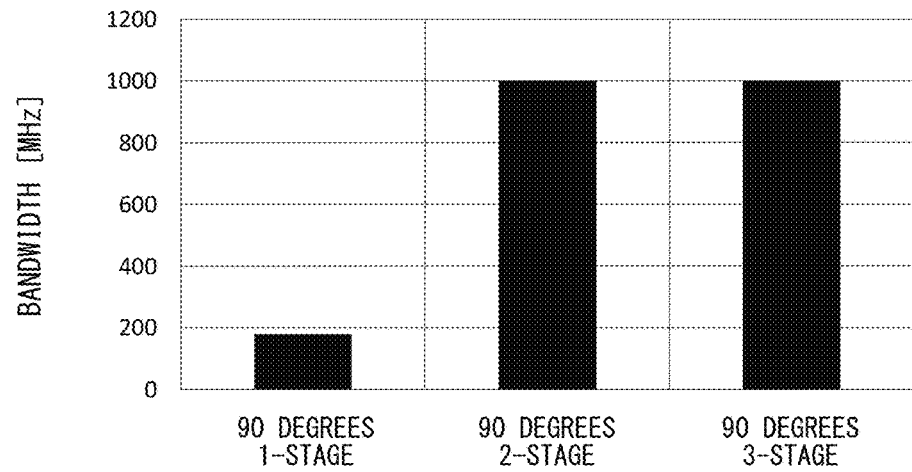

[FIG. 30]
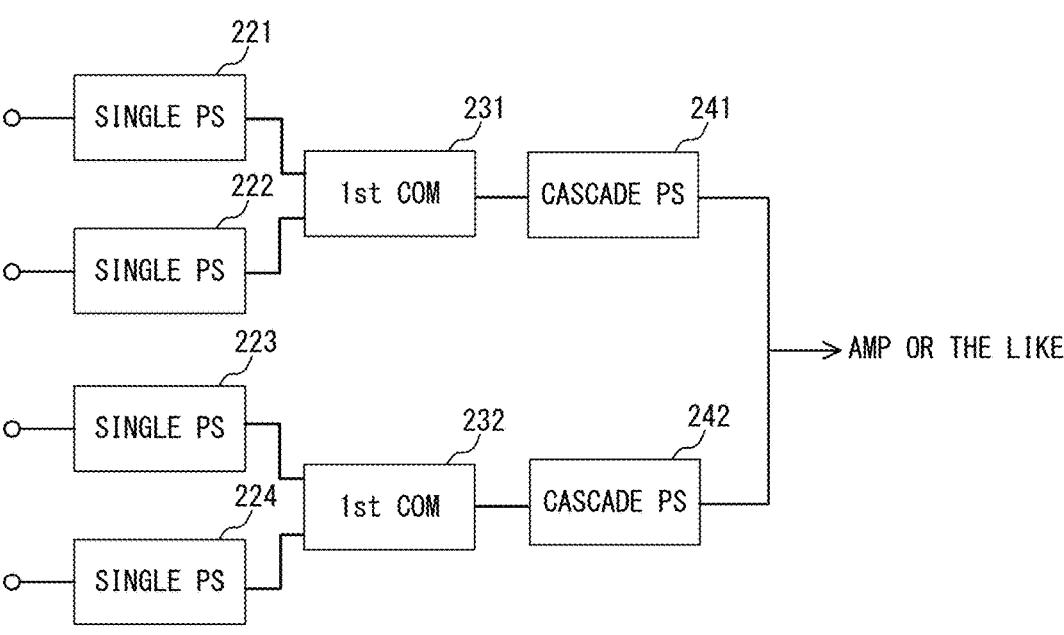
[FIG. 31]
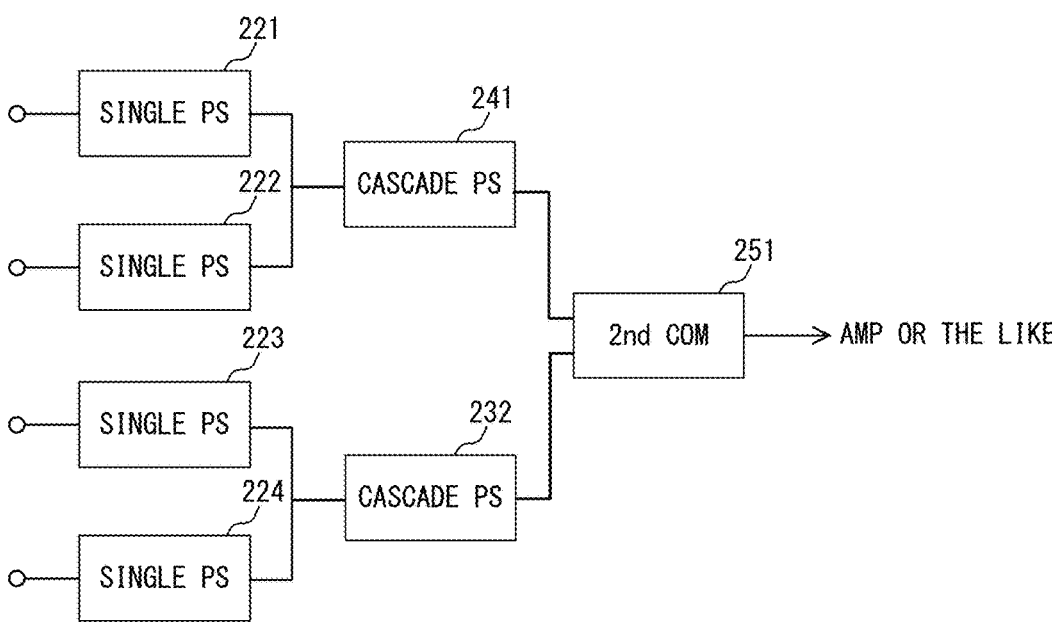

[FIG. 32]
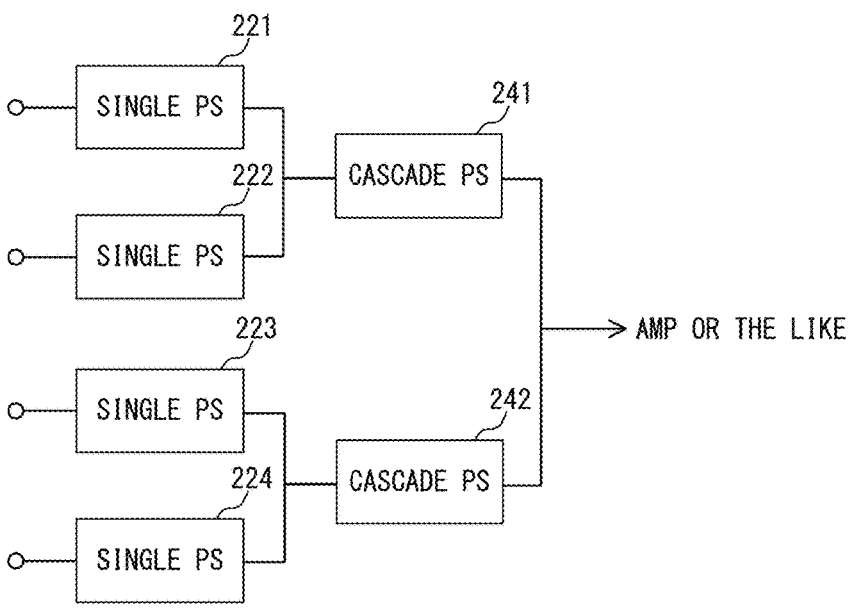
[FIG. 33]
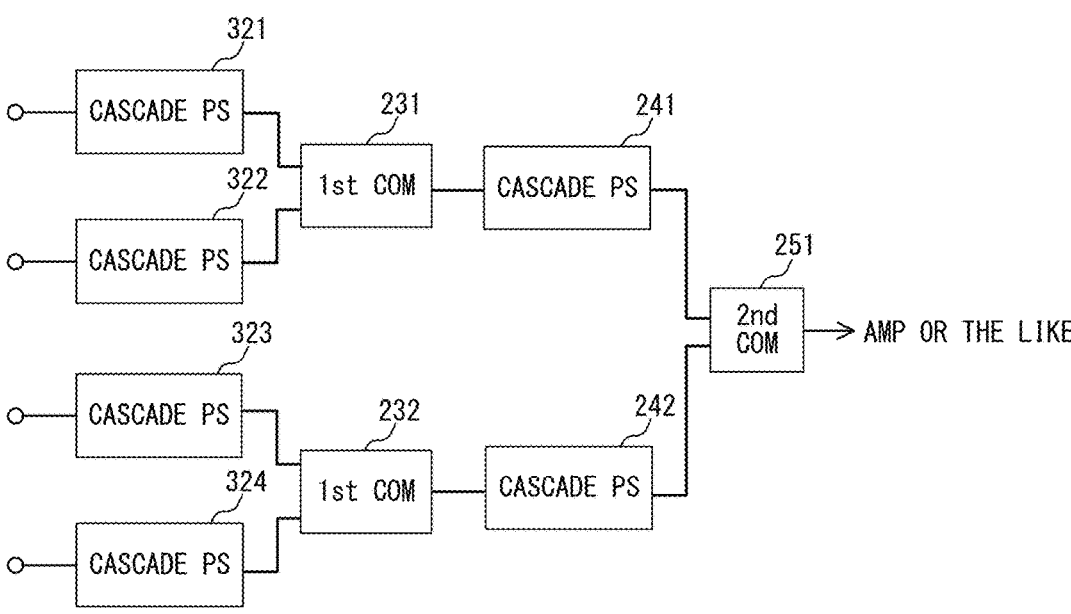

[FIG. 34]
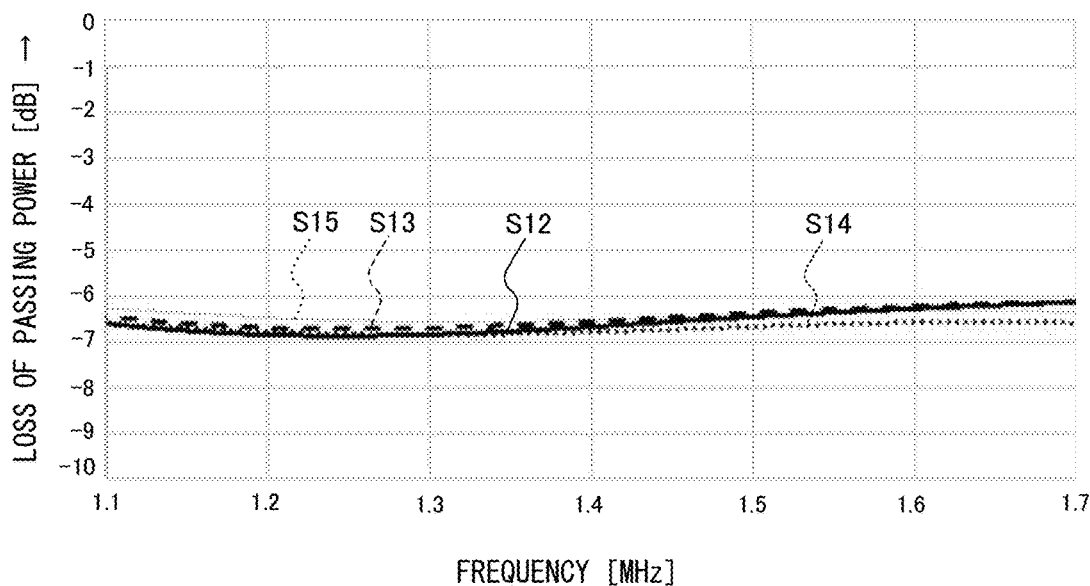
[FIG. 35]
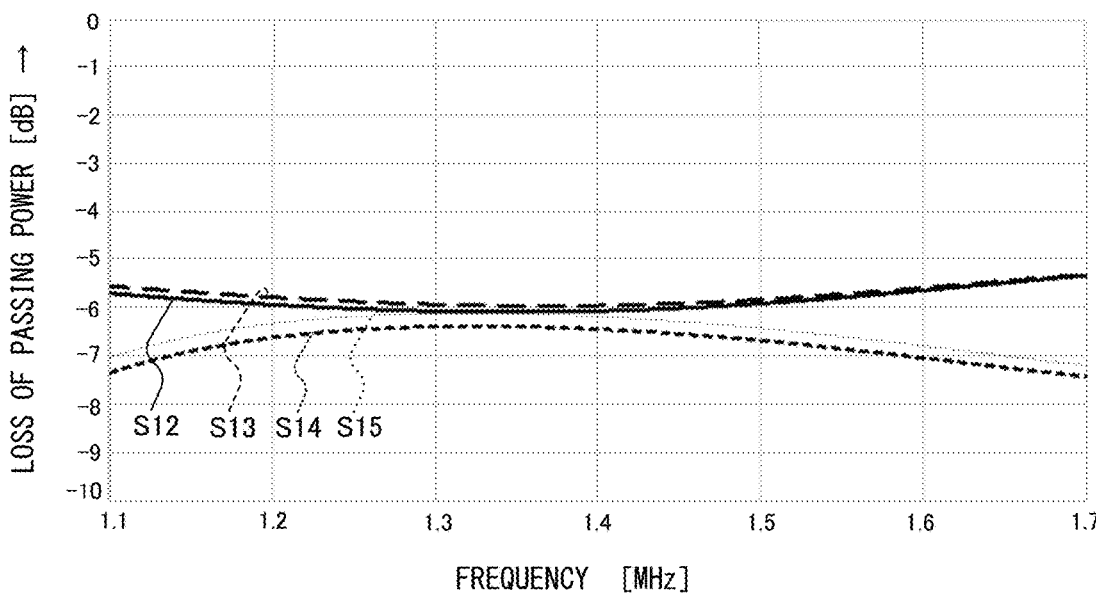

[FIG. 36]
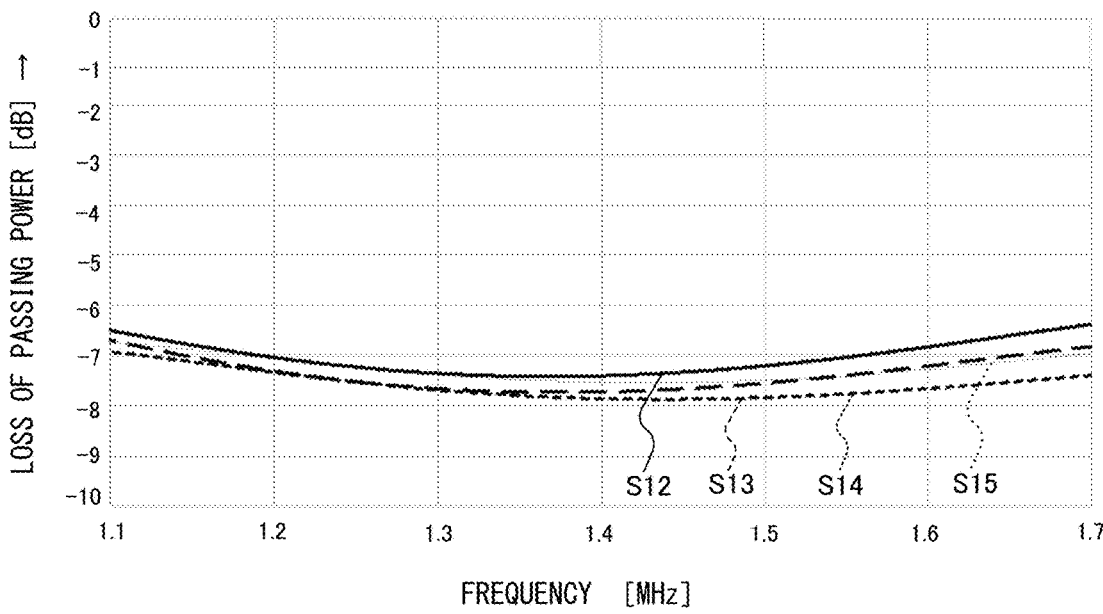
[FIG. 37]
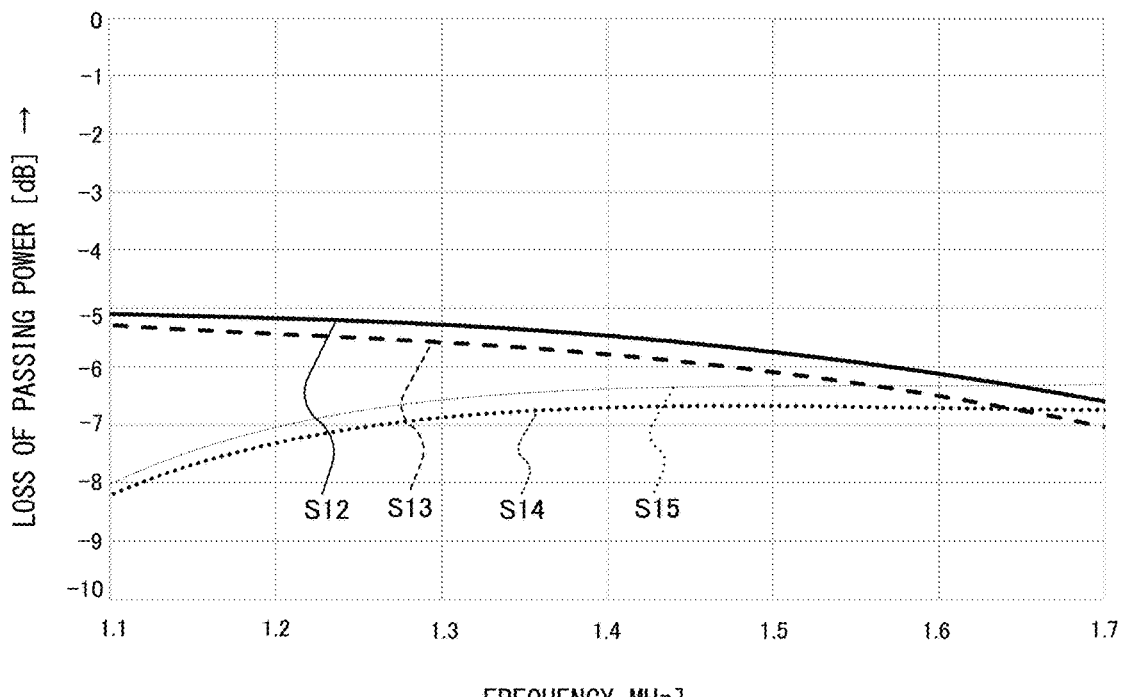

[FIG. 38]
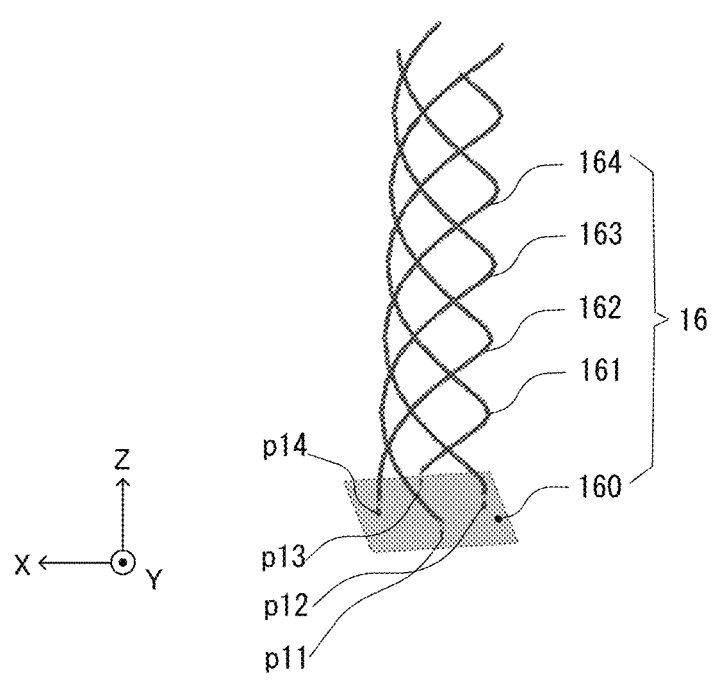
[FIG. 39]
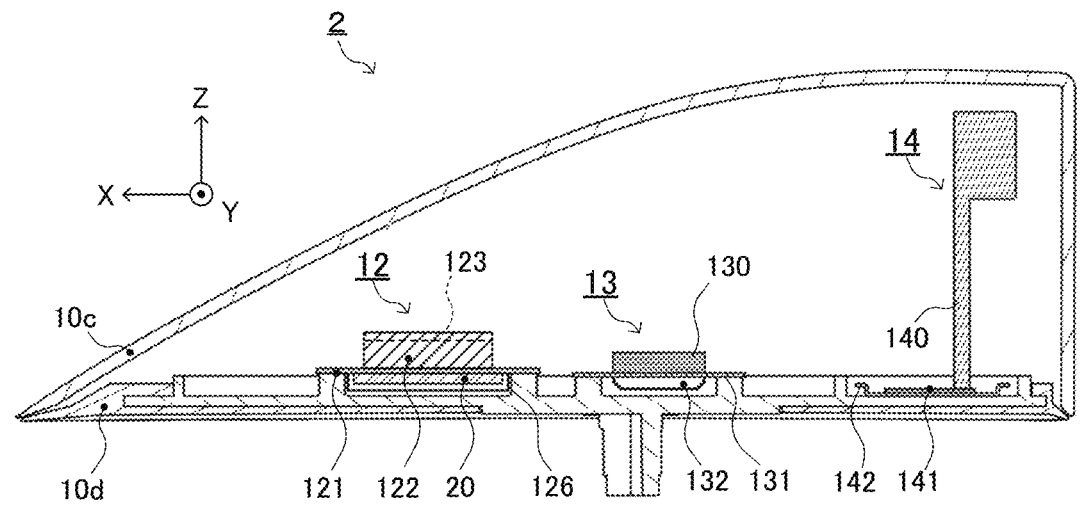

[FIG. 40]
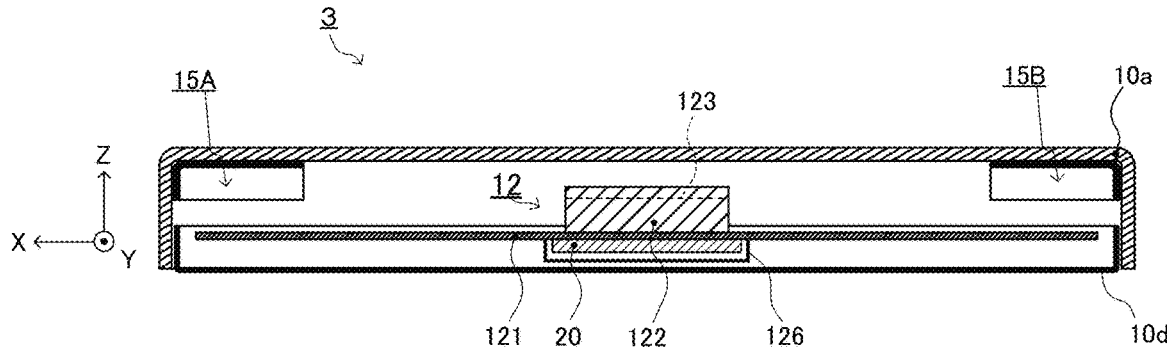
[FIG. 41]
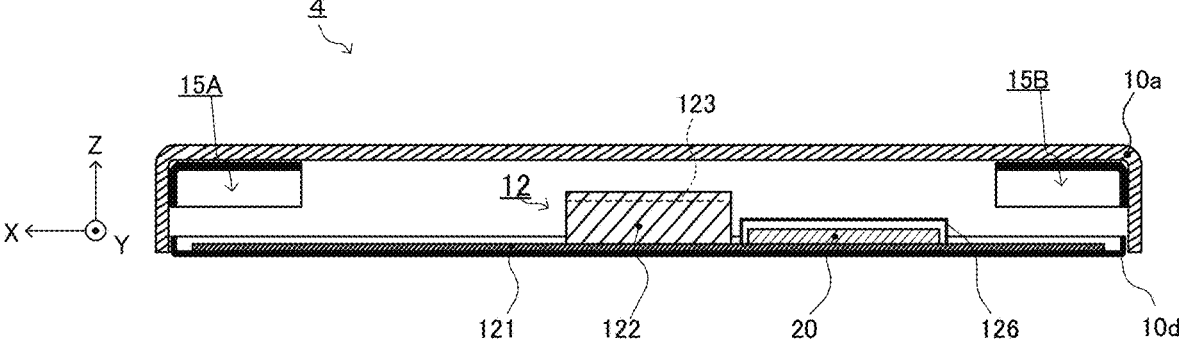

ANTENNA AND CIRCUIT BOARD

CROSS REFERENCE TO PRIOR APPLICATION

This application is a National Stage Patent Application of PCT International Patent Application No. PCT/JP2022/046847 (filed on Dec. 20, 2022) under 35 U.S.C. § 371, which claims priority to Japanese Patent Application No. 2021-212021 (filed on Dec. 27, 2021), which are all hereby incorporated by reference in their entirety.

TECHNICAL FIELD

The present invention relates to an antenna that can be mounted on a vehicle, a robot, and other moving bodies such as a drone that is desired to be reduced in size and weight. In more detail, the present invention relates to a technique that matches phases when causing phase differences of a plurality of signals input with phase differences different from each other from an antenna element to approach zero to integrate the plurality of signals.

BACKGROUND ART

A four-point feeding antenna is used as an antenna for satellite broadcasting. A four-point feeding antenna is a type of a right-handed or left-handed circularly polarized wave antenna, and during reception, it phase-shifts and combines four reception signals respectively having phase differences of 90 degrees from adjacent signals to thereby convert the four signals so that the four signals have the same phase, and inputs one combined signal into a reception circuit. During transmission, the flow is opposite to that during reception except that combining is changed to distribution. In other words, one signal is distributed to a plurality of paths, phase shift is performed in each of the paths to generate four transmission signals having phase differences of 90 degrees from adjacent signals, and these transmission signals are fed to the respective feeding points of the four-point feeding antenna.

Among the circuits that perform such a phase shift, a power feeding circuit for a four-point feeding circularly polarized wave antenna disclosed in Patent Literature 1 is known as the circuit for feeding power. This power feeding circuit has a first power feeding circuit, a second power feeding circuit, and 180 degrees combining and distributing unit. The first power feeding circuit distributes a signal for transmission to two paths with the same phase and the same amplitude. Then, the signals with phase differences of 90 degrees for feeding power to the distributed two paths and the two feeding points of the four feeding points of the circularly polarized wave antenna are respectively output. The second power feeding circuit similarly outputs signals for transmission with a phase difference of 90 degrees for feeding power respectively to the remaining two feeding points among the four feeding points of the circularly polarized wave antenna. The 180 degrees combining and distributing unit outputs the signals with a phase difference of 180 degrees respectively to two paths.

Patent Literature 2 discloses an antenna system for receiving polarized wave signals. The antenna system is different from the power feeding circuit described in Patent Literature 1 in that it has a double microstrip patch laminated structure each with four feeding pins mounted thereon. However, the configuration of the circuit that performs phase shift in the antenna system is generally the same. The circuit that performs phase shift has a combining bridge 21. The combining bridge 21 combines signals S11, S12, S13 and S14 received at the four feeding points of a radiating element 11 according to a 90 degrees phase step and a −90 degrees phase step, for example, and outputs a right-handed circularly polarized wave signal S21 and a left-handed circularly polarized wave signal S22. The outputs of the combining bridge 21 are input into low noise amplifiers 31 to 34.

CITATION LIST

Patent Literature

Patent Literature 1: Japanese Patent Laid-Open No. 2021-111813
Patent Literature 2: Specification of Chinese Patent Application Publication No. 110994199

SUMMARY OF INVENTION

Technical Problem

The power feeding circuit and the circuit that performs phase shift (hereinafter, "the power feeding circuit and the like") in Patent Literatures 1 and 2, phase-shift one of the two signals by −90 degrees, and phase-shift the other one of the two signals by +90 degrees to distribute the signals with a phase difference of 180 degrees, or combine the signals with a phase difference of 0 degrees. When phase shift of the signals is performed, loss of passing power of the signal increases as the amount of phase shifted increases. For example, it is assumed that the phase shift amount of one of the two signals of interest is set to 0 degrees, the phase shift amount of the other signal is set to 180 degrees, and these signals are combined. In this case, since no loss of the passing power occurs for the signal with the phase shift amount of 0, there is less attenuation of the amplitude. On the other hand, for the signal with the phase shift amount of 180 degrees, attenuation of the amplitude is significant due to the effect of loss of the passing power. Therefore, the amplitude difference between the two signals becomes extremely large, and a bandwidth of the frequency at which a desired antenna gain is obtained is narrowed.

For example, as the frequency bands for GNSS (Global Navigation Satellite System), the L1 band (1560 MHz to 1605 MHz), the L2 band (1197 MHz to 1260 MHz), and the L5 band (1150 MHz to 1210 MHz) are used. If only the L1 band is received or only the L5 band is received by one antenna element and one power feeding circuit or the like, the circuits disclosed in Patent Literatures 1 and 2 are sufficiently compatible. However, if two bands, for example, the L1 band and the L2 band, or the L1 band and the L5 band are to be received by one antenna element and one power feeding circuit or the like, gain of one of the L1 band on a high pass side, the L5 band on a low pass side, or the L2 band has to be sacrificed.

Such a problem occurs not only in the case of combining a plurality of signals received by the antenna element for circularly polarized waves, but also similarly occurs in the case of distributing signals when feeding the transmission signal to the antenna element for circularly polarized waves.

One example of an object of the present invention is to provide a phase shift technique capable of suppressing loss of passing power throughout a wide frequency band when phase-shifting a signal input from an antenna element.

Solution to Problem

One aspect of the present invention is an antenna including an antenna element, and a circuit board that converts a plurality of input signals input from the antenna with pre-determined phase differences so that the plurality of input signals have a same phase and outputs the input signals as one signal, wherein the circuit board has a phase circuit portion that phase-shifts each of the plurality of input signals by making a shift direction opposite to that of an adjacent input signal and combines the plurality of input signals that are phase-shifted, and the phase circuit portion includes a cascade-type phase shifter in which a plurality of single-type phase shifters respectively performing phase shift by pre-determined amounts are connected in series.

Another aspect of the present invention is a circuit board that converts four input signals input with mutually different phase differences from an antenna element so that the four input signals have a same phase and outputs the four input signals as one signal, and is the circuit board including a first phase circuit portion that phase-shifts each of the four input signals by making a shift direction opposite to that of the adjacent input signal, and combines the four phase-shifted input signals two by two to output two first combined signals, and a second phase circuit portion that phase-shifts the respective two first combined signals by making shift directions opposite to each other, and combines the two phase-shifted first combined signals to output the one signal, wherein at least one of the first phase circuit portion and the second phase circuit portion includes a cascade-type phase shifter in which a plurality of single-type phase shifters respectively performing phase shift of predetermined amounts are connected in series.

As a result of connecting the plurality of single-type phase shifters in series, phase shift for the input signal is gradually performed in a shared manner. Therefore, it is possible to suppress loss of the passing power of a signal throughout a wide frequency band as compared with the case of performing phase shift of the same amount by one single-type phase shifter.

BRIEF DESCRIPTION OF DRAWINGS

FIG. 1 shows a component structure example of an antenna in a first embodiment.

FIG. 2 shows a structure example of a patch electrode.

FIG. 3 is a perspective view showing a state in which a power feeding circuit is mounted on a back surface of a circuit board.

FIG. 4 is an exemplary diagram of a circuit configuration of the power feeding circuit.

FIG. 5 is a diagram showing a signal state in FIG. 4.

FIG. 6 is an exemplary diagram of a cascade PS of two-stage connection.

FIG. 7 is an exemplary diagram of a cascade PS of three-stage connection.

FIG. 8 is an exemplary diagram of circuit configurations of a π-type 1-stage PS, a π-type 2-stage PS, and a π-type 3-stage PS when performing phase shift of –90 degrees.

FIG. 9 is an exemplary diagram of circuit configurations of a T-type 1-stage PS, a T-type 2-stage PS, and a T-type 3-stage PS when performing phase shift of –90 degrees.

FIG. 10 is an exemplary diagram of circuit configurations of the π-type 1-stage PS, the π-type 2-stage PS, and the π-type 3-stage PS when performing phase shift of +90 degrees.

FIG. 11 is an exemplary diagram of circuit configurations of the T-type 1-stage PS, the T-type 2-stage PS, and the T-type 3-stage PS when performing phase shift of +90 degrees.

FIG. 12 is a diagram showing relationship examples of a design value and reactance of a board strip line in the examples of the –90 degrees π-type 2-stage cascade PS and the +90 degrees π-type 2-stage cascade PS.

FIG. 13 is a diagram showing a configuration example in which reactance for adjustment is connected to the board strip line.

FIG. 14 is a characteristic diagram of loss of passing power according to phase shift amounts of a –90 degrees π-type 1-stage PS.

FIG. 15 is a characteristic diagram of loss of passing power according to phase shift amounts of a –90 degrees T-type 1-stage PS.

FIG. 16 is a characteristic diagram of loss of passing power according to phase shift amounts of a +90 degrees π-type 1-stage PS.

FIG. 17 is a characteristic diagram of loss of passing power according to phase shift amounts of a +90 degrees T-type 1-stage PS.

FIG. 18 is a characteristic diagram of loss of passing power according to phase shift amounts of a –90 degrees π-type 2-stage PS.

FIG. 19 is a characteristic diagram of loss of passing power according to phase shift amounts of a –90 degrees T-type 2-stage PS.

FIG. 20 is a characteristic diagram of loss of passing power according to phase shift amounts of a +90 degrees π-type 2-stage PS.

FIG. 21 is a characteristic diagram of loss of passing power according to phase shift amounts of a +90 degrees T-type 2-stage PS.

FIG. 22 is a characteristic comparison diagram of loss of passing power according to the number of stages of the –90 degrees π-type PS.

FIG. 23 is a characteristic comparison diagram of loss of passing power according to the number of stages of the –90 degrees T-type PS.

FIG. 24 is a characteristic comparison diagram of loss of passing power according to the number of stages of the +90 degrees π-type PS.

FIG. 25 is a characteristic comparison diagram of loss of passing power according to the number of stages of the +90 degrees T-type PS.

FIG. 26 is a bandwidth comparison diagram of –90 degrees π-type 1 to 3 stage PSs.

FIG. 27 is a bandwidth comparison diagram of –90 degrees T-type 1 to 3 stage PSs.

FIG. 28 is a bandwidth comparison diagram of +90 degrees π-type 1 to 3 stage PSs.

FIG. 29 is a bandwidth comparison diagram of +90 degrees T-type 1 to 3 stage PSs FIG. 30 is an exemplary diagram of a power feeding circuit with a second COM omitted.

FIG. 31 is an exemplary diagram of a power feeding circuit with a first COM omitted.

FIG. 32 is an exemplary diagram of a power feeding circuit with the first COM and a second COM omitted.

FIG. 33 is an exemplary diagram of a power feeding circuit with a single PS on a first stage replaced with a cascade PS.

FIG. 34 is a characteristic diagram of loss of passing power of a power feeding circuit including all COMs.

FIG. 35 is a characteristic diagram of loss of passing power of a power feeding circuit with the second COM omitted.

FIG. 36 is a characteristic diagram of loss of passing power of a power feeding circuit with the first COM omitted.

FIG. 37 is a characteristic diagram of loss of passing power of a power feeding circuit with all the COMs omitted.

FIG. 38 is an exemplary diagram of a three-dimensionally shaped antenna element.

FIG. 39 is a side part sectional view showing a structure example of an antenna in a second embodiment.

FIG. 40 is a side part sectional view showing a structure example of an antenna in a third embodiment.

FIG. 41 is a side part sectional view showing a structure example of an antenna in a fourth embodiment.

DESCRIPTION OF EMBODIMENTS

First Embodiment

Hereinafter, embodiments of the present invention will be described. In the first embodiment, an example of the case where the present invention is applied to an antenna of a satellite positioning system (hereinafter, simply referred to as an antenna) capable of simultaneously receiving the L1 band of GNSS and the L5 band of GNSS, or the L1 band of GNSS and the L2 band of GNSS is described. For convenience, orthogonal three-dimensional axes of an X-axis, a Y-axis and a Z-axis are described on the drawings. The X-axis represents a length direction of the antenna, the Y-axis represents a width direction of the antenna, and the Z-axis represents a zenith (vertically upward) direction of the antenna.

A component structure example of the antenna in the first embodiment is shown in FIG. 1. FIG. 1 is a disassembly/assembly view of an antenna 1. Referring to FIG. 1, the antenna 1 is configured by accommodating a GNSS board assembly 12 sealed in an airtight and watertight manner with a packing 11, in an antenna case 10.

The antenna case 10 is a radio-wave transmissive casing configured by a top cover 10*a* and a base cover 10*b*. The top cover 10*a* is a hard resin box, for example, a plastic box with a bottomed cylindrical shape having side portions with slight roundness, and an opening portion having a substantially square shape, in which an upper bottom portion has a substantially square shape, and four corner portions of the opening portion are equally notched. Further, threaded holes corresponding to screws 101 are threaded respectively at inner end portions of the respective corner portions. The base cover 10*b* is an annular body with an outer shape having a substantially square shape, and protruded portions 111 where holes that is used in positioning with the top cover 10*a* and allowing the screws 101 to pass through are formed at the four corner portions.

The protruded portions 111 are molded into such a shape and size as to seal the four corner portions of the top cover 10*a* when the top cover 10*a* is put on the base cover 10*b*. Inside of four side portions between the corner portions of the base cover 10*b*, ribs 112 for supporting the GNSS board assembly 12 are formed, and at one side portion, a cable guide 113 having a recess is formed. The recess of the cable guide 113 is molded with a diameter equal to or less than an outside diameter of a power feeding cable 124 described later. In other words, the recess is molded so that the power feeding cable 124 is pushed into the recess and held in place.

The GNSS board assembly 12 includes a circuit board 121 formed of a thin insulating plate having front and back surfaces, a dielectric body 122 installed in a substantially center portion of the front surface of the circuit board 121, and a patch electrode 123 that is an example of the antenna element and attached to a front surface of the dielectric body 122. Furthermore, the GNSS board assembly 12 includes the power feeding cable 124, and the packing 11 composed of a soft insulator such as rubber and silicon.

A power feeding circuit 20 is provided on a back surface of the circuit board 121. One end of the power feeding cable 124 is conductively connected to an output terminal of the power feeding circuit 20, and the other end is supported by the cable guide 113 of the base cover 10*b* to be exposed to an outside of the antenna case 10. Further, the one end of the power feeding cable 124 is kept airtight and watertight by the packing 11. The GNSS board assembly 12 is not limited to this shape. In a mounting tape 13, four corner portions for passing the screws 101 through the holes of the protruded portions 111 of the base cover 10*b* are each notched inward in an arc shape. Further, the mounting tape 13 is pasted on the back surface of the base cover 10*b*. Though not shown, on a back surface side of the circuit board 121, a shield cover is mounted to cover all or a part of the power feeding circuit 20.

The patch electrode 123 may be a metal plate having a predetermined shape substantially parallel to a ground conductor (for example, a vehicle roof), for example, a square shape. The patch electrode 123 can be fixedly attached slightly inward from an outer periphery of the front surface of the dielectric body 122. A structure example of the patch electrode 123 is shown in FIG. 2. In the example of FIG. 2, four power feeding terminal portions p11, p12, p13 and p14 are formed in the patch electrode 123, at positions equidistant and equally spaced from a center portion thereof, and point symmetrical. These four power feeding terminal portions p11, p12, p13 and p14 correspond one-to-one to four board terminal portions of the circuit board 121 described later. A distance between the center point of the patch electrode 123 and the position of each of the power feeding terminal portions p11, p12, p13, and p14 is set to a distance that allows matching (for example, 50 ohms) of impedance of the patch electrode 123 in a frequency band to be used, for example.

In the patch electrode 123, four slots SL1, SL2, SL3, and SL4 are formed along the respective sides of the square, inside of the outer periphery of the patch electrode 123, and outside with respect to the respective power feeding terminal portions p11, p12, p13, and p14. "Slot" refers to a cut-out portion of a metal plate. The respective slots SL1, SL2, SL3, and SL4 are located line-symmetrically with respect to an axis of symmetry passing through the center point of the patch electrode 123, and point-symmetrically with respect to the center point.

Further, meandering (zigzag) portions SL1*m*, SL2*m*, SL3*m*, and SL4*m* are formed in substantially intermediate portions of straight line portions parallel to the respective sides in the four slots SL1, SL2, SL3, and SL4. The power feeding terminal portions p11, p12, p13, and p14 are formed in substantially center portions of the closest meandering portions SL1*m*, SL2*m*, SL3*m*, and SL4*m*. The meandering portions SL1*m*, SL2*m*, SL3*m*, and SL4*m* are formed to make an electrical length longer and transmission and/or reception frequencies lower than when these meandering portions are not mounted. Therefore, it is possible to fine-tune transmittable and/or receivable frequencies by properly adjusting sizes of the meandering portions SL1*m*, SL2*m*, SL3*m*, and SL4*m* after manufacturing or before manufacturing. A degree of freedom of design of the antenna increases, and the antenna is flexibly adaptable to the required transmission and/or reception bands.

In the first embodiment, the four power feeding terminal portions p11, p12, p13, and p14 are present each at an equal distance from the center point of the patch electrode 123.

Feeding phases (phases during power feeding, same here-inafter) in the respective power feeding terminal portions p11, p12, p13, and p14 are different by 90 degrees from the power feeding phases of the other adjacent power feeding terminal portions p11, p12, p13, and p14. Therefore, the patch electrode 123 performs an antenna operation and a slot operation. The antenna operation is an operation of trans-mitting and/or receiving radio waves of frequencies that satisfy resonance conditions due to the length of one side and a dielectric constant of the dielectric body 122. The slot operation is an operation of transmitting and/or receiving radio waves of frequencies that satisfy resonance conditions in consideration of the electric lengths of the slots SL1, SL2, SL3, and SL4, and the meandering portions SL1m, SL2m, SL3m, and SL4m.

The frequency that satisfies the resonance conditions is a frequency at which the electrical length determined by the length of the one side of the patch electrode 123 and the dielectric constant of the dielectric body 122 becomes an approximately ½ wavelength (and an integer multiple thereof), in the antenna operation. In the slot operation, it is a frequency at which the electrical length determined by the total length of the meandering portions SL1m, SL2m, SL3m, and SL4m and the slots SL1, SL2, SL3, and SL4 and the dielectric constant of the dielectric body 122 is approxi-mately ½ wavelength (and an integer multiple thereof). An overall length of the meandering portions SL1m, SL2m, SL3m, and SL4m and the slots SL1, SL2, SL3, and SL4 is, for example, a length of edges from one ends to the other ends of the slots and a length of edges from one ends to the other ends of the meandering portions.

Since four-point power feeding is performed while shift-ing phase by 90 degrees between the adjacent power feeding terminal portions sequentially at equal amplitudes at the positions line-symmetrical and point-symmetrical, radio waves received by the patch electrode 123 are circularly polarized waves. When the shift amount of a phase increases clockwise seen from a top surface of the patch electrode 123, the radio waves are right-handed circularly polarized waves, and when the shift amount of the phase increases counter-clockwise, the radio waves are left-handed circularly polar-ized waves. In other words, according to the first embodi-ment, it becomes easy to realize reception of circularly polarized waves in two frequency bands (for example, the L1 band and the L5 band, or the L1 band and the L2 band) of GNSS by the single antenna 1.

Note that in the first embodiment, mounting the slots with the meandering portions formed therein, along the respec-tive sides of the square of the patch electrode 123 is described. However, the slots may have any shapes (for example, a shape without the meandering portion), or may be mounted in any spots (for example, spots along respective corner portions of the square of the patch electrode) if only the slots are located line-symmetrically with respect to the axis of symmetry passing through the center portion of the patch electrode 123, and point-symmetrically with respect to the center point.

Next, the circuit board 121 will be described. The circuit board 121 has the power feeding circuit 20 that performs phase shift with low pass loss. FIG. 3 is a perspective view showing a state where the power feeding circuit 20 is mounted on the back surface of the circuit board 121. Though the details are omitted in FIG. 3, the power feeding circuit 20 can be configured by a lumped constant circuit including a distributed constant line (conductor pattern group) and passive elements formed by being printed on the back surface of the circuit board 121. Alternatively, the power feeding circuit 20 can also be configured by the distributed constant line.

A circuit configuration example of the power feeding circuit 20 is shown in FIG. 4. Also, a signal state when the power feeding circuit 20 is configured as in FIG. 4 is shown in FIG. 5. The power feeding circuit 20 has four board terminal portions p21, p22, p23, and p24, a first phase circuit portion 200A, a second phase circuit portion 200B, and one output terminal s31. The board terminal portions p21, p22, p23, and p24 are conductively connected respectively to the four power feeding terminal portions p11, p12, p13, and p14 formed in the patch electrode 123 in one-to-one correspon-dence, with conductive pins or the like. The output terminal s31 is connected to an amplification unit (AMP) located in the circuit board 121, and thereafter is conductively con-nected to an external device via the aforementioned power feeding cable 124.

A first input signal s1 having a reference phase is input into the board terminal portion p21 from the power feeding terminal portion p11. The reference phase is a phase angle that is an origin of a phase difference with respect to other first input signals s2 to s4, and may be 0 degrees or may be other than 0 degrees. A second input signal s2 a phase of which is shifted by 90 degrees with respect to the first input signal s1 is input into the board terminal portion p22 from the power feeding terminal portion p12. A third input signal s3 a phase of which is shifted by 90 degrees with respect to the second input signal s2 is input into the board terminal portion p23 from the power feeding terminal portion p13. A fourth input signal s4 a phase of which is shifted by 90 degrees with respect to the third input signal s3 is input into the board terminal portion p24 from the power feeding terminal portion p14.

When the above-described reference phase generated by reception timing of the circularly polarized wave signal of the patch electrode 123 is 0 degrees, a phase difference of the second input signal s2 is −90 degrees, a phase difference of the third input signal s3 is −180 degrees, and a phase difference of the fourth input signal is −270 degrees. The shown example is an example of the right-handed circularly polarized wave signal, and in the case of the left-handed circularly polarized wave signal, the phase difference "s1−90 degrees" of the second input signal s2 is "s1+90 degrees". The same applies to the third input signal s3 and the fourth input signal s4. In this way, the respective input signals s1 to s4 of the feeding points adjacent to each other have phase differences of 90 degrees with respect to the input signals of the adjacent feeding points.

The first phase circuit portion 200A has MCs (abbrevia-tion for matching circuit, the same applies hereinafter) 211, 212, 213, and 214 corresponding to the board terminal portions p21 to p24 one-to-one. The MCs 211 to 214 are circuits that perform impedance matching between the patch electrode 123 and the power feeding circuit 20. All the four circuits have conductor patterns with the same shape, area and arrangement relationship, and can be implemented by lumped constant circuits, distributed constant circuits or a combination of them.

To the MC 211, a first single PS (single PS is a single-type phase shifter or phase shift circuit, the same applies here-inafter) 221 that performs a phase shift by A degrees with respect to the first input signal s1 is connected. To the MC 212, a second single PS 222 that performs a phase shift by B degrees with respect to the second input signal s2 is connected. To the MC 213, a third single PS 223 that performs a phase shift by C degrees with respect to the third input signal s3 is connected. To the MC 214, a fourth single PS 224 that performs a phase shift by D degrees with respect to the fourth input signal s4 is connected.

The MCs 211 to 214 can be properly omitted. By omitting the MCs 211 to 214, the configuration of the power feeding circuit 20 is simplified, the circuit board 121 can be reduced in size, and as a result, reduction in size and weight of the antenna 1 can be achieved.

Two signals sf11 and sf12 that are phase-shifted so that a phase difference becomes 0 degrees are combined in a first COM (COM is a combining unit, the same applies hereinafter) 231, and are input into a first cascade PS (cascade PS is a cascade-type phase shifter or phase shift circuit, the same applies hereinafter) 241 as one first combined signal m11. The other two signals sf13 and sf14 that are phase-shifted so that the phase difference becomes 0 degrees are combined in a first COM 232 that is another combining unit, and input into a second cascade PS 242 as one first combined signal m12.

The first cascade PS 241 connects a plurality of single PSs that perform a predetermined amount of phase shift in series, and performs a phase shift of E degrees in total with respect to the first combined signal m11, and outputs a signal sf21. The second cascade PS 242 similarly connects a plurality of single PSs that perform a predetermined amount of phase shift in series, performs a phase shift of F degrees in total with respect to the first combined signal m12 that is the other combined signal, and outputs a signal sf22. In this way, the two signals sf21 and sf22 that are phase-shifted are combined in a second COM 251, and output as one second combined signal m21 from an output terminal P31 to a post-stage AMP or the like.

Shift directions (polarity notation) of A degrees and B degrees, C degrees and D degrees, and the E degrees and F degrees, which are phase shift amounts, are respectively opposite to each other. Assume that each of the single PSs 221 to 224 and each of cascades PSs 241 and 242 are configured by connecting ideal elements by a transmission line in which phase change during transmission can be ignored. As design values (ideal values) in a certain aspect in this assumption, +45 is for A and C, and −45 for B and D, +90 for E, and −90 for F. In this case, a phase difference between the E degrees and the F degrees is 180 degrees. However, in each of the actual single PSs 221 to 224, and each of the cascade PSs 241 and 242, there are circumstances in which the amount of phase shift does not always match the design value, as described later. Therefore, for example, various patterns shown below can be properly adopted, and any of them is a phase shift amount that substantially approximates the numerals.

$$\text{First pattern: } A = C = +45, B = D = -45$$

$$E = +90, F = -90.$$

$$\text{Second pattern: } A = +60, B = -30, C = +60, D = -30,$$

$$E = +90, F = -90.$$

$$\text{Third pattern: } A = +60, B = -30, C = +50, D = -40,$$

$$E = +90, F = -80.$$

These patterns are examples, and the patterns are not limited to them.

The present invention can be carried out if the input signals s1 to s4 that are input into the board terminal portions p21 to p24 respectively with phase differences have phase differences of 0 degrees in the output of the first cascade PS 241 and the second cascade PS 242, and therefore, A to F are not limited to the above-described three patterns. Further, when the respective input signals s1 to s4 are left-handed circularly polarized wave signals, the polarities of the above-described A to F are opposite to those described above.

Next, specific configuration examples of the first cascade PS 241 and the second cascade PS 242 will be described. Each of the cascade PSs 241 and 242 is configured by connecting a plurality of single PSs that perform a predetermined amount of phase shift in series.

FIG. 6 is an exemplary diagram of a cascade PS of two-stage connection, and FIG. 7 is an exemplary diagram of a cascade PS of three-stage connection. The same components and signals as in FIG. 4 and FIG. 5 are assigned with the same reference signs.

In an example of FIG. 6, the first cascade PS 241 is configured by connecting a first stage single PS 611 with a phase shift amount of N degrees and a second stage single PS 612 with a phase shift amount of M degrees in series. Further, the second cascade PS 242 is configured by connecting a first stage single PS 621 with a phase shift amount of P degrees and a next stage single PS 622 with a phase shift amount of Q degrees in series. Relationships of N, M, P, and Q are as follows. However, when the respective input signals s1 to s4 are left-handed circular polarized wave signals, polarities of N, M, P, and Q are opposite to the above.

$$+N + M = E$$

$$+P + Q = F$$

In an example of FIG. 7, the first cascade PS 241 is configured by connecting a first stage single PS 711 with a phase shift amount of X degrees, a second stage single PS 712 with a phase shift amount of Y degrees, and a third stage single PS 713 with a phase shift amount of Z degrees in series. Further, the second cascade PS 242 is configured by connecting a first stage single PS 721 with a phase shift amount of U degrees, a second stage single PS 722 with a phase shift amount of V degrees, and a third stage single PS 723 with a phase shift amount of W degrees in series. Relationships of X, Y, Z, U, V, and W are as follows. However, when the respective input signals s1 to s4 are left-handed circularly polarized wave signals, polarities of X, Y, Z, U, V, and W are opposite to the above.

$$+X + Y + Z = E$$

$$+U + V + W = F$$

Each of the cascades PSs 241 and 242 can be configured by a π-type circuit or a T-type circuit a cutoff frequency (rejection frequency) of which is set to a frequency near a band edge of the GNSS frequency band. The π-type circuit and the T-type circuit are known circuit configurations in which inductors and capacitors are combined to be in a π-type or T-type. All of the plurality of single PSs 611, 612, 621, 622, 711 to 713, and 721 to 723 may be configured by π-type circuits or T-type circuits, or may be configured by both in combination.

Hereinafter, characteristics of loss of passing power will be described, when the above-descried phase shift amount of E degrees is set to +90 degrees, the phase shift amount of F degrees is set to −90 degrees, and the phase of a signal is shifted by two or three stages of single PSs like the first cascade PS 241 and the second cascade PS 242 in a shared manner, for convenience of explanation. For convenience, a single PS configured by a π-type circuit may be referred to as a "π-type 1-stage", and a single PS configured by a T-type circuit may be referred to as a "T-type 1-stage". Further, a cascade PS configured by two π-type circuits connected in series may be referred to as a "π-type 2-stage", a cascade PS configured by three π-type circuits connected in series may be referred to as a "π-type 3-stage", a cascade PS configured by two T-type circuits connected in series may be referred to as a "T-type 2-stage", and a cascade PS configured by three T-type circuits connected in series may be referred to as a "T-type 3-stage".

First, a circuit configuration example will be described. FIG. 8 is a circuit configuration example of each of a π-type 1-stage PS, π-type 2-stage PS, and π-type 3-stage PS in the case of performing a phase shift of −90 degrees. In the π-type 1-stage PS, an inductor $L_{101}$ is connected between one ends of two capacitors $C_{101}$ and $C_{102}$ the other ends of which are each grounded. In the π-type 2-stage PS, an inductor $L_{201}$ is connected between one ends of two capacitors $C_{201}$ and $C_{202}$ the other ends of which are each grounded. Further, in the π-type 2-stage PS, an inductor $L_{202}$ is connected between one ends of two capacitors $C_{202}$ and $C_{203}$ the other ends of which are each grounded. The capacitor $C_{202}$ in the middle is a result of making two capacitors that would be in parallel when connected in series one capacitor to reduce the number of elements. In the π-type 3-stage PS, an inductor $L_{301}$ is connected between one ends of two capacitors $C_{301}$ and $C_{302}$ the other ends of which are each grounded. Further, in the π-type 3-stage PS, an inductor $L_{302}$ is connected between one ends of two capacitors $C_{302}$ and $C_{303}$ the other end of which are each grounded. Further, in the π-type 3-stage PS, an inductor $L_{303}$ is connected between one ends of two capacitors $C_{303}$ and $C_{304}$ the other ends of which are each grounded. Each of the capacitors $C_{302}$ and $C_{303}$ is a result of making two capacitors that would be in parallel when connected in series one capacitor to reduce the number of elements.

FIG. 9 is a circuit configuration example of each of a T-type 1-stage PS, a T-type 2-stage PS, and a T-type 3-stage PS when performing a phase shift of −90 degrees. In the T-type 1-stage PS, a capacitor $C_{111}$ the other end of which is grounded is connected between two inductors $L_{111}$ and $L_{112}$ connected in series. In the T-type 2-stage PS, a capacitor $C_{211}$ the other end of which is grounded is connected between two inductors $L_{211}$ and $L_{212}$. In the T-type 2-stage PS, a capacitor $C_{212}$ the other end of which is grounded is connected between two inductors $L_{212}$ and $L_{213}$. The inductor $L_{212}$ in the middle is a result of making two inductors that would be connected in series when connected in series one inductor to reduce the number of elements. In the T-type 3-stage PS, a capacitor $C_{311}$ the other end of which is grounded is connected between two inductors $L_{311}$ and $L_{312}$, and a capacitor $C_{312}$ the other end of which is grounded is connected between another set of two inductors $L_{312}$ and $L_{313}$. In the T-type 3-stage PS, a capacitor $C_{313}$ the other end of which is grounded is connected between still another set of two inductors $L_{313}$ and $L_{314}$. Each of the inductors $L_{312}$ and $L_{313}$ is a result of making two inductors that would be in series when connected in series one inductor to reduce the number of elements.

FIG. 10 is a circuit configuration example of each of the π-type 1-stage PS, the π-type 2-stage PS, and the π type 3-stage PS when performing a phase shift of +90 degrees. In the π-type 1-stage PS, a capacitor $C_{121}$ is connected between one ends of two inductors $L_{121}$ and $L_{122}$ the other end of which are each grounded. In the π-type 2-stage PS, a capacitor $C_{221}$ is connected between one ends of two inductors $L_{221}$ and $L_{222}$ the other ends of which are each grounded. Further, in the π-type 2-stage PS, a capacitor $C_{222}$ is connected between one ends of two inductors $L_{222}$ and $L_{223}$ the other ends of which are each grounded. The inductor $L_{222}$ in the middle is a result of making two inductors that would be in parallel when connected in series one inductor to reduce the number of elements. In the π-type 3-stage PS, a capacitor $C_{321}$ is connected between one ends of two inductors $L_{321}$ and $L_{322}$ the other ends of which are each grounded. In the π-type 3-stage PS, a capacitor $C_{322}$ is connected between one ends of two inductors $L_{322}$ and $L_{323}$ the other ends of which are each grounded, and a capacitor $C_{323}$ is further connected between one ends of two inductors $L_{323}$ and $L_{324}$ the other ends of which are each grounded. Each of the inductors $L_{322}$ and $L_{323}$ is a result of making two inductors that would be in parallel when connected in series one inductor to reduce the number of elements.

FIG. 11 is a circuit configuration example of each of the T-type 1-stage PS, the T-type 2-stage PS, and the T-type 3-stage PS when performing a phase shift of +90 degrees. In the T-type 1-stage PS, an inductor $L_{131}$ the other end of which is grounded is connected between two capacitors $C_{131}$ and $C_{132}$ connected in series. In the T-type 2-stage PS, an inductor $L_{231}$ the other end of which is grounded is connected between two capacitors $C_{231}$ and $C_{232}$. In the T-type 2-stage PS, an inductor $L_{232}$ the other end of which is grounded is connected between two capacitors $C_{232}$ and $C_{233}$. The capacitor $C_{232}$ in the middle is a result of making two capacitors that would be in series when connected in series one capacitor to reduce the number of elements. In the T-type 3-stage PS, an inductor $L_{331}$ the other end of which is grounded is connected between two capacitors $C_{331}$ and $C_{332}$, and an inductor $L_{332}$ the other end of which is grounded is connected between another set of two capacitors $C_{332}$ and $C_{333}$. Furthermore, in the T-type 3-stage PS, an inductor $L_{333}$ the other end of which is grounded is connected between still another set of two capacitors $C_{333}$ and $C_{334}$. Each of the capacitors $C_{332}$ and $C_{333}$ is a result of making two capacitors that would be in series when connected in series one capacitor to reduce the number of elements.

Here, the circumstances that must be taken into consideration when embodying the circuit configurations shown in FIGS. 8 to 11 are mentioned. Even when inductors and capacitors are the same standard products made by the same manufacturers, the electrical characteristics thereof have variations, and may not match the electrical characteristics of ideal elements. Further, when they are mounted on a board of a dielectric body, reactance of the board strip line may increase depending on the dielectric constant of the board, the length of the transmission line, or the like, and due to this, the phase shift amount may be significantly deviated from the design value.

For example, FIG. 12 shows a relationship example of a design value and reactance of a board strip line in each of examples of the −90 degrees π-type 2-stage cascade PS and the +90 degrees π-type 2-stage cascade PS described above. Capacitors $C_{201}$, $C_{202}$, $C_{203}$, $C_{221}$, and $C_{222}$, and inductors L201, L202, L221, L222, and L223 surrounded by solid lines are design values, and $L_1$ to $L_{10}$ indicated by broken lines are reactance of the board strip lines. The reactance $L_1$ to $L_{10}$ of the substrate strip line may cause a phase shift of approximately 30 degrees with respect to the design value in frequency bands of L1, L2 and L5 bands. Therefore, even if the design value of the phase shift amount is, for example, +90 degrees, the phase may not shift by only about 60 degrees in reality.

In the first embodiment, as illustrated in FIG. 6 or FIG. 7, for example, the phase shift of E degrees or F degrees is performed by a plurality of single PSs connected in series in a shared manner. Therefore, even if there is variation in the electrical characteristics of any single PS, it can be compensated for by reversing the electrical characteristics of the other single PS. Further, for example, in FIG. 6, by setting lengths and areas such that 1) a distribution constant of the transmission line connecting the first stage single PS 611 and the second stage single PS 612 of the cascade PS 241 to each other, and 2) a distribution constant of the transmission line connecting the first stage single PS 621 and the second stage single PS 622 of the cascade PS 242 to each other cancel out each other, it is possible to eliminate or alleviate the influence of the reactance $L_1$ to $L_{10}$ of the substrate strip line.

For example, it is assumed that the phase shift amount of the first cascade PS 241 which is 90 degrees in design value is changed to 60 degrees by the influence of the reactance $L_1$ to $L_{10}$ of the board strip line. In this case, if the dielectric bodies are the same and the lengths of the transmission lines are the same, the phase shift amount of the second cascade PS 242 also becomes −120 degrees from −90 degrees by the influence of the reactance $L_1$ to $L_{10}$ of the substrate strip line. As a result, the phase difference between the two first phase shift signals sf21 and sf22 does not change from the design value. In other words, the reactance $L_1$ to $L_{10}$ of the substrate strip line can be cancelled out. The same can be said for the example of FIG. 7. Therefore, as in the first cascade PS 241 and the second cascade PS 242, the number of inductors and capacitors is increased, and even if there is a variation in any one of the elements, it can be covered with another element. This can eliminate or alleviate variations in the elements. In addition, by equalizing the total lengths of the transmission lines, reactance $L_1$ to $L_{10}$ of the board strip line is easily cancelled.

In actual manufacturing, work for changing the length and the area of the board strip line is not easy after once forming the board strip line. For this reason, by inserting adjustment reactance into the board strip line, it is possible to easily cancel the reactance $L_1$ to $L_{10}$ of the board strip line. FIG. 13 is an example in which adjusting capacitors $C_{501}$ and $C_{502}$ are inserted into the board strip line shown FIG. 12 as an example of adjustment reactance. Insertion positions of the adjusting capacitors $C_{501}$ and $C_{502}$ are not limited to the example of FIG. 13 but may be other positions. Further, the adjustment reactance may be an adjusting inductor or a combination of an adjustment capacitor and adjustment reactance. Further, a pair of conductive pads for connecting element may be mounted at an arbitrary position in advance, and a pair of terminals of the adjusting reactance may be connected to the conductive pads later.

Next, with reference to FIG. 14 to FIG. 26, loss (power loss) of passing power of the first cascade PS 241 and the second cascade PS 242 will be described. FIG. 14 to FIG. 25 show calculation values from simulation, vertical axes represent loss [dB] of passing power, and horizontal axes represent frequencies [MHz]. Resonance frequencies (frequencies at which loss of passing power becomes zero) are each set to approximately 1400 MHZ (substantially intermediate frequency between a lower limit frequency of the L2 and L5 bands and an upper limit frequency of the L1 band).

FIG. 14 is a characteristic diagram of loss of the passing power according to phase shift amounts of the −90 degrees π-type 1-stage PS. Further, FIG. 15 is a characteristic diagram of loss of the passing power according to the phase shift amounts of the −90 degrees T-type 1-stage PS. The 1-stage PS is the above-described single PS. These examples show magnitudes of the loss of the passing power when the phase shift amount is changed by 10 degrees from −10 degrees to −90 degrees. As is obvious from FIG. 14 and FIG. 15, with a phase shift amount of an absolute value of 30 degrees or less, less than 20 degrees in particular, there is little loss of passing power. On the other hand, as the absolute value of the phase shift amount becomes larger than 30 degrees, or as the frequency becomes high, the loss of the passing power suddenly becomes large, and the resonance frequency becomes difficult to match.

FIG. 16 is a characteristic diagram of loss of passing power according to phase shift amounts of the +90 degrees π-type 1-stage PS. Further, FIG. 17 is a characteristic diagram of loss of passing power according to phase shift amounts of the +90 degrees T-type 1-stage PS. These examples show magnitudes of passing loss when changing the phase shift amount by 10 degrees from +10 degrees to +90 degrees. As is obvious from FIG. 16 and FIG. 17, with the phase shift amount of an absolute value of 30 degrees or less, less than 20 degrees, in particular, there is little loss of passing power. On the other hand, as the phase shift amount becomes larger than 30 degrees, or the frequency becomes high, the loss of the passing power suddenly becomes large, and the resonance frequency becomes difficult to match.

FIG. 18 is a characteristic diagram of loss of passing power according to phase shift amounts of −90 degrees π-type 2-stage PS. Further, FIG. 19 is a characteristic diagram of loss of passing power according to phase shift amounts of the −90 degrees T-type 2-stage PS. For convenience of comparison, in FIG. 18, the loss of the passing power of the −90 degrees π-type 1-stage PS shown in FIG. 14 is additionally written as −90 degrees (1-stage), and in FIG. 19, the loss of the passing power of the −90 degrees T-type 1-stage PS shown in FIG. 15 is additionally written as −90 degrees (1-stage). The 2-stage PS and the 3-stage PS described later are the cascade PSs described above. (−10−80) degrees indicates that "N" shown in FIG. 6 is −10 and "M" is −80. The same applies for combinations of other phase shift amounts. As is obvious from FIG. 18 and FIG. 19, it can be seen that by using the −90 degrees 2-stage PS, whether it is a π-type circuit or a T-type circuit, loss of passing power that is significantly smaller than the −90 degrees 1-stage PS can be maintained in a wide frequency range from the upper limit frequency of the L1 band on the high side to the lower limit frequency of the L5 band or the L2 band on the low side.

FIG. 20 is a characteristic diagram of loss of passing power according to phase shift amounts of the +90 degrees π-type 2-stage PS. Further, FIG. 21 is a characteristic diagram of loss of passing power according to phase shift amounts of the +90 degrees T-type 2-stage PS. For convenience of comparison, in FIG. 20, the loss of the passing power of the +90 degrees π-type 1-stage PS shown in FIG. 16 is additionally written and in FIG. 21, the loss of the passing power of the +90 degrees T-type 1-stage PS shown in FIG. 17 is additionally written, each as 90 degrees (1-stage). (10+80) degrees indicates that "N" shown in FIG. 6 is 10 and "M" is 80. The same applies for other combinations of phase shift amounts. As is obvious from FIG. 20 and FIG. 21, it can be seen that by using the +90 degrees 2-stage PS, whether it is a π-type circuit or a T-type circuit, loss of passing power significantly smaller than the +90 degrees 1-stage PS can be maintained in a wide frequency range from the upper limit frequency of the L1 band on the high side to the lower limit frequency of the L5 band or the L2 band on the low side.

FIG. 22 is a characteristic comparison diagram of loss of passing power according to the numbers of stages of the −90 degrees π-type PS. Further, FIG. 23 is a characteristic comparison diagram of loss of passing power according to the numbers of stages of the −90 degrees T-type PS. A 1-stage represents −90 degrees 1-stage PS, a 2-stage represents −90 degrees 2-stage PS, and a 3-stage represents −90 degrees 3-stage PS. The 2-stage and the 3-stage are examples of the case where the phase amounts N and M shown in FIG. 6 are both 45, and the case where the phase amounts X, Y, and Z shown in FIG. 7 are all 30, for convenience. As is obvious from FIG. 22 and FIG. 23, it can be seen that if the combined phase shift amounts are the same, whether it is a π-type circuit or a T-type circuit, smaller loss of passing power can be maintained in a wide frequency range from the upper limit frequency of the L1 band on the high side to the lower limit frequency of the L5 band or the L2 band on the low side, as the number of stages is larger.

FIG. 24 is a characteristic comparison diagram of loss of passing power according to the numbers of stages of the +90 degrees π-type PS. Further, FIG. 25 is a characteristic comparison diagram of loss of passing power according to the numbers of stages of the +90 degrees T-type PS. A 1-stage represents +90 degrees 1-stage PS, a 2-stage represents +90 degrees 2-stage PS, and a 3-stage represents +90 degrees 3-stage PS. The 2-stage and 3-stage are examples of the case where the phase amounts N and M shown in FIG. 6 are both 45, and the case where the phase amounts X, Y, and Z shown in FIG. 7 are all 30, for convenience. As is obvious from FIG. 24 and FIG. 25, it can be seen that if the combined phase shift amounts are the same, whether it is a π-type circuit or a T-type circuit, smaller loss of passing power can be maintained in a wide frequency range from the upper limit frequency of the L1 band on the high side to the lower limit frequency of the L5 band or the L2 band on the low side, as the number of stages is larger.

Next, with reference to FIG. 26 to FIG. 29, bandwidths according to the circuit configurations and the numbers of stages will be described. In each of FIG. 26 to FIG. 29, a vertical axis represents a band width [MHz] within −0.01 dB, and a horizontal axis represents the number of stages when the phase shift amount is +90 degrees.

FIG. 26 is a bandwidth comparison diagram of the −90 degrees π-type 1 to 3-stage PSs. A "90 degrees 1-stage" is an example of the case of the −90 degrees π-type 1-stage. Average loss of the passing power is −0.3678 [dB], and a bandwidth is 201 [MHz]. A "90 degrees 2-stage" is an example of the case of a (−45−45) degrees π-type 2-stage. Average loss of the passing power is −0.0063 [dB], and a bandwidth is 932 [MHz]. A "90 degrees 3-stage" is an example of the case of (−30−30−30) degrees π-type 3-stage. Average loss of the passing power is −0.0010 [dB], and a bandwidth is 1001 [MHz].

FIG. 27 is a bandwidth comparison diagram of the −90 degrees T-type 1 to 3 stage PSs. A "90 degrees 1-stage" is an example of the case of the −90 degrees T-type 1-stage. Average loss of the passing power is −0.4622 [dB], and a bandwidth is 176 [MHz]. A "90 degrees 2-stage" is an example of the case of a (−45−45) degrees T-type 2-stage. Average loss of the passing power is −0.0063 [dB], and a bandwidth is 932 [MHz]. "90 degrees 3-stage" is an example of the case of (−30−30−30) degrees T-type 3-stage. Average loss of the passing power is −0.0009 [dB], and a bandwidth is 1001 [MHz].

FIG. 28 is a bandwidth comparison diagram of the +90 degrees π-type 1 to 3 stage PSs. A "90 degrees 1-stage" is an example of the case of the +90 degrees π-type 1-stage. Average loss of the passing power is −0.1873 [dB], and a bandwidth is 201 [MHz]. A "90 degrees 2-stage" is an example of the case of a (45+45) degrees π-type 2-stage. Average loss of the passing power is −0.0047 [dB], and a bandwidth is 990 [MHz]. A "90 degrees 3-stage" is an example of the case of (30+30+30) degrees π-type 3-stage. Average loss of the passing power is −0.0008 [dB], and a bandwidth is 1001 [MHz].

FIG. 29 is a bandwidth comparison diagram of the +90 degrees T-type 1 to 3 stage PSs. A "90 degrees 1-stage" is an example of the case of the +90 degrees T-type 1-stage. Average loss of the passing power is −0.2286 [dB], and a bandwidth is 180 [MHz]. A "90 degrees 2-stage" is an example of the case of a (45+45) degrees T-type 2-stage. Average loss of the passing power is −0.0048 [dB], and a bandwidth is 1001 [MHz]. A "90 degrees 3-stage" is an example of the case of (30+30+30) degrees T-type 3-stage. Average loss of the passing power is −0.0008 [dB], and a bandwidth within −0.01 dB is 1001 [MHz].

As is obvious from FIG. 26 to FIG. 29, it can be seen that if the combined phase shift amounts are the same, whether it is a π-type circuit or a T-type circuit, a bandwidth in which loss of the passing power as low as −0.01 dB or less is maintained is significantly increased, as the number of stages connected in series is larger. Therefore, by the only one power feeding circuit 20 using the one patch electrode 123 and the cascades PSs 141 and 142, use in the L1 band on the high side and the L5 band or L2 band on the low side of the GNSS can be covered.

Modification 1

In the first embodiment, it is described that the MCs 211 to 214 can be omitted on implementing the present invention, but it is possible to modify the various other configurations. FIG. 30 is an exemplary diagram of a configuration in which the second COM 251 is omitted. FIG. 31 is an exemplary diagram of a configuration in which the two first COMs 231 and 232 are omitted. FIG. 32 is an exemplary diagram of a configuration in which the two first COMs 231 and 232 and the second COM 251 are omitted. Further, FIG. 33 is an exemplary diagram of a configuration in which the four single PSs 221, 222, 223 and 224 are respectively replaced with cascade PSs 321, 322, 323, and 324. As in FIG. 33, effects of replacing the single PSs with the cascade PSs are as described above.

By omitting COMs as in FIG. 30 to FIG. 32, two signals that are phase-shifted are directly input into the cascade PS at a post stage. Therefore, what effect an aspect of omission has on the degree of loss of passing power will be described below.

FIG. 34 is a characteristic diagram of loss of passing power when all the first COMs 231 and 232 and the second COM 251 are mounted. FIG. 35 is a characteristic diagram of loss of passing power according to the configuration example of FIG. 30. FIG. 36 is a characteristic diagram of loss of passing power according to the configuration example in FIG. 31. FIG. 37 is a characteristic diagram of loss of passing power by the configuration example of FIG. 32. In each of them, a vertical axis represents a loss amount (dB) of the passing power, and a horizontal axis represents a frequency. Further, in the drawings, S12 is a loss amount of passing power between the power feeding terminal portion p11 among the four power feeding terminal portions P11, p12, p13 and p14 formed on the patch electrode 123, and the output terminal p31 of the power feeding circuit 20. S13 is a loss amount of passing power between the power feeding terminal portion p12 and the output terminal p31. S14 is a loss amount of passing power between the power feeding terminal portion p13 and the output terminal p31. S15 is a loss amount of passing power between the power feeding terminal portion p14 and the output terminal p31.

In each of the configuration examples in FIG. 35 to FIG. 37, the variation in the loss amount (dB) corresponding to the frequency is larger as compared with that of the configuration example of FIG. 34. However, when attention is paid to only the L1, L5, and L2 bands, a difference in the total loss amount in the band is very small (around 1 dB) even in the configuration example of FIG. 37 in which the first COMs 231 and 232 and the second COM 251 are all omitted, as compared with the configuration example of FIG. 34 in which all of them are mounted. Accordingly, considering the antenna as a whole, the degree of contribution to simplification and miniaturization of the power feeding circuit 20, and reduction in size and weight of the antenna 1 due to omission of these COMs may be larger.

In the configuration example of FIG. 33, for example, only the single PS 221 in which A is 60 and the single PS 224 in which C is −60, that is, only the single PSs in which the absolute values of the phase shift amounts are relatively large may be replaced with cascade PSs in the second pattern. However, in the case of this example, for the single PS 222 in which B is −30, and the single PS 224 in which D is +30, the transmission line lengths are desirably made long so that reactance of the board strip line becomes the same as that of the single PSs 221 and 224 to be paired. Further, the second phase circuit portion 200B may be made a single PS, and only the respective single PSs 221 to 224 of the first phase circuit portion 200A can also be replaced with the cascade PSs.

Further, in the third pattern, for example, only the single PS 221 in which A is 60 and the single PS 224 in which C is −50, that is, only the single PSs in which absolute values of the phase shift amounts are relatively large may be replaced with the cascade PSs. However, in the case of this example, for the single PS 222 in which B is −30, and the single PS 224 in which D is +40, transmission line lengths are desired to be made long so that reactance of the board strip lines becomes the same as that of the single PSs 221 and 224 to be paired. Further, in the third pattern, the second phase circuit portion 200B may be made a single PS, and only the respective single PSs 221 to 224 of the first phase circuit portion 200A may be replaced with the cascade PSs similarly to the second pattern.

Modification 2

In the first embodiment, the example of the case in which the antenna element is a four-power feeding type of patch electrode 123 having the four power feeding terminal portions p11, p12, p13, and p14 is described, but the present invention is similarly applicable to a three-dimensional antenna element or an antenna element that is two-power feeding type of patch electrode having two power feeding terminal portions.

For example, the two power feeding terminal portions are present at equal distances and equal intervals from a center point of the patch electrode. A power feeding phase (phase during power feeding, the same below) in one of the power feeding terminal portions differs from a power feeding phase of the other adjacent power feeding terminal portion by 90 degrees. An input signal as a reference phase is input from the one power feeding terminal portion of the two power feeding terminal portions. The reference phase is a phase angle that is an origin of the phase difference with respect to an input signal of the other one and may be 0 degrees or may be other than 0 degrees. Into the other power feeding terminal portion, an input signal having a phase shifted by 90 degrees with respect to the input signal is input from the one power feeding terminal portion. This enables an embodiment in which one input signal is phase-shifted by A degrees in the first single PS of FIG. 4, and the other input signal is phase-shifted by B degrees in the second single PS. In this embodiment, the two signals phase-shifted so that the phase difference becomes 0 degrees are combined in the first COM 231 and output to an AMP as one combined signal.

A circuit configuration of a power feeding circuit in the two-power feeding type of patch electrode having the two power feeding terminals is configured by, for example, the first single PS 221, the second single PS 222, and the first COM 231 of the power feeding circuit 20 shown in FIG. 4. Other configurations are omitted. The first COM 231 is connected to the AMP via the output terminal p31. Then, an input signal phase-shifted by A degrees in the first single PS 221 and an input signal phase-shifted by B degrees in the second single PS 222 are combined in the first COM 231, and output to the AMP as one combined signal. Here, the first single PS 221 and the second single PS 222 may be changed to the cascade PS 241 and the cascade PS 242 shown in FIG. 6 and FIG. 7. For example, various patterns shown below can also be adopted as appropriate for the antenna element of the two-power feeding type of patch electrode having the two power feeding terminal portions.

First pattern: $A = 0, B = -90$.

Second pattern: $A = +45, B = -45$.

Third pattern: $A = +60, B = -30$.

Further, for example, FIG. 38 is an exemplary diagram of a three-dimensionally shaped antenna element. The antenna element includes a planar electrode 160 in which four power feeding terminal portions p11, p12, p13, and p14 are formed, and four linear conductive elements 161, 162, 163, and 164 extending spirally in a Z direction respectively from the respective power feeding terminal portions p11, p12, p13, and p14. The respective linear conductive elements 161, 162, 163, and 164 receive signals with phase differences of 90 degrees from one another without contacting the adjacent linear conductive elements.

Modification 3

In the first embodiment, the power feeding circuit 20 used at the time of receiving the L1, L2, and L5 bands of the GNSS is descried, but the power feeding circuit 20 can also be implemented as a power feeding circuit or the like used at the time of transmission. In this case, a flow of the signal is in a direction opposite to the flow described in the first embodiment. In other words, a signal input into an output terminal s31 is an input signal, and a second COM 251, and first COMs 231 and 232 are distribution circuits. Further, respective input signals s1 to s4 are signals respectively having phase differences of 90 degrees from adjacent signals.

Second Embodiment

With reference to FIG. 39, a second embodiment of the present invention will be described. Components having the same functions as those of the first embodiment are assigned with the same reference signs for convenience. In the second embodiment, an example of an antenna 2 in which a board assembly 13 for XM, and a board 14 for TEL are mixedly mounted in one antenna case in addition to a board assembly 12 for GNSS will be described.

The antenna case is configured by an antenna cover 10c having a shark fin shape and formed of a radio wave transmissive member, and a resin antenna base 10d in which a recess for accommodating the board assembly 12 for GNSS, the board assembly 13 for XM, and the board 14 for TEL is formed. The board assembly 12 for GNSS is the same as that in the antenna 1 of the first embodiment in that it has a circuit board 121, a dielectric body 122, a patch electrode 123, and a power feeding circuit 20, but in the second embodiment, a size of the antenna base 10d is relatively large as compared to an area of the circuit board 121. Further, in order to shield the power feeding circuit 20 from radiated noise from a transmission antenna and other antennas around the circuit board 121, the power feeding circuit 20 is mounted with a shield cover 126 capable of obtaining a shield stronger than the shield in embodiment 1.

The board assembly 13 for XM includes an XM patch antenna 130, a circuit board 131, and a shield cover 132. Respective configurations and structures are the same as those of the board assembly 12 for GNSS. However, a usage frequency band of the board assembly 13 for XM is a 2.3 GHz band. The board assembly 13 for XM is disposed at a distance in which interference with the board assembly 12 for GNSS is suppressed.

The board assembly 14 for TEL is an assembly for long distance communication (Telecommunication), and includes an element 140 for TEL, a circuit board 141, and a shield plate 142. A frequency band capable of transmission and/or reception in the element 140 for TEL is, for example, a telephone frequency band of 600 MHz to 6 GHz. The circuit board 141 is a matching circuit to make the antenna broadband during reception. The shield plate 142 is a metal plate that has a ground potential during operation and is mounted along the recess of the antenna base 10d, between a noise generation source and the circuit board 141.

The element 140 for TEL is formed so that a height of a tip end portion is higher than the board assembly 12 for GNSS and the board assembly 13 for XM, and an area of a vicinity of the tip end portion is relatively larger than that of a vicinity of a base end portion. A shape of the vicinity of the tip end portion is a rectangle, but the shape may be another shape. The board assembly 14 for TEL is disposed separately by a distance in which isolation from the board assembly 12 for GNSS and the board assembly 13 for XM can be ensured.

Since the antenna 2 configured in this way enables mobile communication with only the antenna 2 disposed in one case for not only the GNSS band, but also the XM band and the TEL band, the antenna 2 can also flexibly cope with high functionality of on-vehicle communication apparatuses.

Third Embodiment

Next, with reference to FIG. 40, a third embodiment of the present invention will be described. Components having same functions as in the second embodiment are assigned with the same reference signs for convenience. In the third embodiment, an example of an antenna 3 is described, in which in addition to a board assembly 12 for GNSS, two board assemblies 15A and 15B for TEL are accommodated in a flat type antenna case with a thickness in a Z direction being 20 mm or less. The antenna 3 has an antenna cover 10a formed of a radio wave transmissive member, and a resin antenna base 10d having a hollow box shape in which a front surface in a +Z direction is a plane. The antenna cover 10a has a main surface portion parallelly facing a top front surface of the antenna base 10d, and side surface portions that respectively bend in a −Z direction from a peripheral edge of the main surface portion to extend toward an antenna mounting surface, and are joined to outer peripheries of side surface portions of the antenna base 10d.

An opening portion is formed in the top front surface of the antenna base 10d. In the board assembly 12 for GNSS, a circuit board 121 is mounted on a back surface side of the top front surface of the antenna base 10d. A dielectric body 122 and a patch electrode 123 that are fixed to a substantially center portion of the circuit board 121 are exposed from the opening portion of the antenna base 10d. The point in that a power feeding circuit 20 is attached to the back surface side of the circuit board 121 is the same as in the first embodiment, but in the third embodiment, the power feeding circuit 20 is covered with a shield cover 126 as in the second embodiment.

The two board assemblies 15A and 15B for TEL are assemblies including elements for mobile communication that enable communication at the same timing in the same frequency band or by switching transmission and reception. The elements for mobile communication can adopt various shapes and sizes according to usage frequencies. In one aspect, the element for mobile communication of the board assembly 15A for TEL is a three-dimensional metal plate that is pasted on a part of a main surface back side including one corner portion of four corner portions of the antenna cover 10a and a part of two adjacent side surface portion inner walls. The element for mobile communication may have a shape extending across vicinities of two corner portions of the four corner portions. The same applies to the element for mobile communication of the board assembly 15B for TEL, but the element for mobile communication of the board assembly 15B for TEL is desirably mounted in a part farthest from the element for mobile communication of the board assembly 15A for TEL in the antenna cover 10a. As a result, practically sufficient isolation (10 dB to 15 dB) can be secured.

In the antenna 3 configured in this manner, the board assembly 12 for GNSS and the two board assemblies 15A and 15B for TEL are mounted side by side in a low antenna case with a height of approximately 20 mm. Therefore, even if the vehicle side communication apparatus is multi-functionalized, the antenna 3 can flexibly cope with it although the antenna 3 has a small size and a low profile.

In the third embodiment, the two board assemblies 15A and 15B for TEL are shown, but the four board assemblies for TEL in total may be mounted each for each of vicinities of the four corner portions of the antenna cover 10a. By mounting two or more board assemblies for TEL in this manner, MIMO (Multiple-Input Multiple-Output) communication can be performed with the one antenna 3.

Fourth Embodiment

With reference to FIG. 41, a fourth embodiment of the present invention will be described. In the fourth embodiment, an example of an antenna 4 obtained by further reducing the thickness of the antenna 3 of the third embodiment will be described. Components having the same functions as in the third embodiment are assigned with the same reference signs for convenience.

In the antenna 4, a power feeding circuit 20 and a shield cover 126 of a GNSS board assembly 12 are disposed on a front surface of a circuit board 121. Specifically, it is configured by disposing a dielectric body 122 and the power feeding circuit 20 on a front surface of the circuit board 121, and covering the power feeding circuit 20 with the shield cover 126. Other configurations, operations and the like of the antenna 4 are the same as in the antenna 3 of the third embodiment.

In the antenna 4, the dielectric body 122 with a patch electrode 123 mounted on a front surface thereof and the power feeding circuit 20 are placed on the same surface of the circuit board 121, and therefore, a thickness of an antenna base 10*d* in a Z direction can be made thin. Therefore, a height of the entire antenna 4 can be made lower than that of the antenna 3 of the third embodiment.

The antennas of the first to the fourth embodiments themselves can be mounted on movable bodies such as robots and drones, and are also usable in an antenna device for vehicle in which antenna units for various frequency bands have been mixedly mounted in one case in recent years.

REFERENCE SIGNS LIST

1 antenna, 10 antenna case, 12 GNSS board assembly, 121, 141 circuit board, 122 dielectric body, 123 patch electrode, 126 shield cover, 20 power feeding circuit, p11, p12, p13, p14 power feeding terminal portion, p21, p22, p23, p24 board terminal portion, 200A first phase circuit portion, 200B second phase circuit portion, 241, 242, 321, 322, 323, 324 cascade PS, 221 to 224, 611, 612, 621, 622, 711 to 713, 721 to 723 single PS, 160 planar electrode, 161, 162, 163, 164 linear conductive element, 13 XM board assembly, 14 board for TEL, 140 element for TEL, 142 shield plate, 15A, 15B board assembly for TEL.

The invention claimed is:

1. A circuit board that converts a plurality of input signals input from an antenna element with mutually different phase differences so that the plurality of input signals have a same phase and outputs the input signals as one combined signal, comprising:

a phase circuit portion configured to phase-shift each of the plurality of input signals so that a shift direction of each input signal is opposite to a shift direction of an adjacent input signal and combines the plurality of input signals that are phase-shifted, wherein the phase circuit portion includes a cascade phase shifter in which a plurality of single phase shifters respectively performing phase shift by predetermined amounts are connected in series.

2. The circuit board according to claim 1, wherein the plurality of input signals are a first input signal, a second input signal having a phase different by 90 degrees with respect to the first input signal, a third input signal having a phase different by 90 degrees with respect to the second input signal, and a fourth input signal having a phase different by 90 degrees with respect to the third input signal, and wherein the phase circuit portion comprises:

a first phase circuit portion that phase-shifts the first input signal by A degrees, phase-shifts the second input signal by B degrees, phase-shifts the third input signal by C degrees, phase-shifts the fourth input signal by D degrees, and outputs a first combined signal obtained by combining the first input signal phase-shifted by A degrees and the second input signal phase-shifted by B degrees, and a second combined signal obtained by combining the third input signal phase-shifted by C degrees, and the fourth input signal phase-shifted by D degrees (provided that A+B+C+D=0); and a second phase circuit portion comprises the cascade phase shifter which includes a first cascade phase shifter that phase-shifts the first combined signal output from the first phase circuit portion by E degrees, and a second cascade phase shifter that phase-shifts the second combined signal output from the first phase circuit portion by F degrees (provided that E+F=−10 or more to +10 or less).

3. The circuit board according to claim 2, wherein the first phase circuit portion directly combines the first input signal and the second input signal that are each phase-shifted, and/or the third input signal and the fourth input signal that are each phase-shifted.

4. The circuit board according to claim 2, wherein the second phase circuit portion directly combines the two combined signals that are each phase-shifted.

5. The circuit board according to claim 1, wherein the plurality of input signals are a first input signal, a second input signal having a phase different by 90 degrees with respect to the first input signal, a third input signal having a phase different by 90 degrees with respect to the second input signal, and a fourth input signal having a phase different by 90 degrees with respect to the third input signal, and wherein the phase circuit portion comprises:

a first phase circuit portion that phase-shifts the first input signal by A degrees, phase-shifts the second input signal by B degrees, phase-shifts the third input signal by C degrees, phase-shifts the fourth input signal by D degrees, and outputs a first combined signal obtained by combining the first input signal phase-shifted by A degrees and the second input signal phase-shifted by B degrees, and a second combined signal obtained by combining the third input signal phase-shifted by C degrees and the fourth input signal phase-shifted by D degrees (provided that A+B+C+D≠0); and a second phase circuit portion comprises the cascade phase shifter which includes a first cascade phase shifter that phase-shifts the first combined signal output from the first phase circuit portion by E degrees, and a second cascade phase shifter that phase-shifts the second combined signal output from the first phase circuit portion by F degrees (provided that E+F=−10 or more to +10 or less).

6. An antenna, comprising:

the circuit board according to claim 1; and the antenna element, wherein the antenna element has a patch electrode.

7. The antenna according to claim 6, wherein a plurality of sets of the antenna element and the circuit board are disposed on a same surface of an antenna base.

8. An antenna, comprising:

the circuit board according to claim 1; and the antenna element, wherein the antenna element has a patch electrode, and wherein, in the patch electrode, two or more power feeding terminals having power feeding phases different by 90 degrees are formed.

9. A circuit board that converts four input signals input with mutually different phase differences from an antenna element so that the four input signals have a same phase and outputs the four input signals as one combined signal, comprising:

a first phase circuit portion that phase-shifts each of the four input signals by making a shift direction opposite to that of the adjacent input signal, and combines the four phase-shifted input signals two by two to output two first combined signals; and a second phase circuit portion that phase-shifts the respective two first combined signals by making shift directions opposite to each other, and combines the two phase-shifted first combined signals to output the one signal, wherein at least one of the first phase circuit portion and the second phase circuit portion includes a cascade phase shifter in which a plurality of single shifters respectively performing phase shift of predetermined amounts are connected in series.

10. An antenna, comprising:

the circuit board according to claim 9; and the antenna element, wherein the antenna element has a patch electrode.

\*  \*  \*  \*  \*